(12) United States Patent
Masuoka et al.

(10) Patent No.: US 9,768,294 B2
(45) Date of Patent: Sep. 19, 2017

(54) METHOD FOR PRODUCING SEMICONDUCTOR DEVICE AND SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 42 days.

(21) Appl. No.: 14/753,774

(22) Filed: Jun. 29, 2015

(65) Prior Publication Data
US 2015/0303301 A1 Oct. 22, 2015

Related U.S. Application Data

(63) Continuation of application No. PCT/JP2013/061247, filed on Apr. 16, 2013.

(51) Int. Cl.
*H01L 29/78* (2006.01)
*H01L 21/02* (2006.01)
(Continued)

(52) U.S. Cl.
CPC .... *H01L 29/7827* (2013.01); *H01L 21/02524* (2013.01); *H01L 21/02587* (2013.01);
(Continued)

(58) Field of Classification Search
CPC .................................................. H01L 29/42356
See application file for complete search history.

(56) References Cited

U.S. PATENT DOCUMENTS 5,124,769 A 6/1992 Tanaka et al.
6,891,234 B1 5/2005 Connelly et al.
(Continued)

FOREIGN PATENT DOCUMENTS

JP H02-071556 A 3/1990
JP H02-188966 A 7/1990
(Continued)

OTHER PUBLICATIONS

International Search Report and Written Opinion with English translation for PCT/JP2013/061247 dated Jun. 25, 2013, 7 pages.
(Continued)

*Primary Examiner* — John P Dulka
(74) *Attorney, Agent, or Firm* — Brinks Gilson & Lione

(57) ABSTRACT

A semiconductor device includes a fin-shaped semiconductor layer, a first insulating film formed around the fin-shaped semiconductor layer, a first metal film formed around the first insulating film, a pillar-shaped semiconductor layer formed on the fin-shaped semiconductor layer, a gate insulating film formed around the pillar-shaped semiconductor layer, a gate electrode formed around the gate insulating film and made of a third metal, a gate line connected to the gate electrode, a second insulating film formed around a sidewall of an upper portion of the pillar-shaped semiconductor layer, and a second metal film formed around the second insulating film. The upper portion of the pillar-shaped semiconductor layer and the second metal film are connected to each other, and an upper portion of the fin-shaped semiconductor layer and the first metal film are connected to each other.

5 Claims, 39 Drawing Sheets

(51) Int. Cl.
| | |
|---|---|
| H01L 21/283 | (2006.01) |
| H01L 21/306 | (2006.01) |
| H01L 21/31 | (2006.01) |
| H01L 21/311 | (2006.01) |
| H01L 21/3205 | (2006.01) |
| H01L 21/3213 | (2006.01) |
| H01L 29/06 | (2006.01) |
| H01L 29/16 | (2006.01) |
| H01L 29/423 | (2006.01) |
| H01L 29/66 | (2006.01) |

(52) U.S. Cl.
CPC ...... *H01L 21/283* (2013.01); *H01L 21/30604* (2013.01); *H01L 21/31* (2013.01); *H01L 21/31111* (2013.01); *H01L 21/32051* (2013.01); *H01L 21/32133* (2013.01); *H01L 29/0657* (2013.01); *H01L 29/16* (2013.01); *H01L 29/42356* (2013.01); *H01L 29/66666* (2013.01); *H01L 29/7828* (2013.01)

(56) References Cited

U.S. PATENT DOCUMENTS

| | | | | |
|---|---|---|---|---|
| 8,735,971 | B2* | 5/2014 | Masuoka | H01L 29/7827 |
| | | | | 257/329 |
| 8,759,178 | B2* | 6/2014 | Masuoka | H01L 29/78 |
| | | | | 257/329 |
| 9,117,690 | B2* | 8/2015 | Masuoka | H01L 29/775 |
| 9,299,701 | B2* | 3/2016 | Masuoka | H01L 29/775 |
| 2002/0009833 | A1 | 1/2002 | Lin et al. | |
| 2005/0224847 | A1* | 10/2005 | Masuoka | H01L 27/115 |
| | | | | 257/288 |
| 2010/0264485 | A1 | 10/2010 | Masuoka et al. | |
| 2012/0049252 | A1 | 3/2012 | Masuoka et al. | |

FOREIGN PATENT DOCUMENTS

| | | |
|---|---|---|
| JP | H03-145761 A | 6/1991 |
| JP | 04-111469 A | 4/1992 |
| JP | 10-209407 A | 8/1998 |
| JP | 11-297984 A | 10/1999 |
| JP | 2002-050770 A | 2/2002 |
| JP | 2004-356314 A | 12/2004 |
| JP | 2007-329480 A | 12/2007 |
| JP | 2010-251678 A | 11/2010 |
| JP | 2012-004473 A | 1/2012 |

OTHER PUBLICATIONS

English translation of International Preliminary Report on Patentability for corresponding International Application No. PCT/JP2013/061247 dated Oct. 29, 2015, 8 pages.

* cited by examiner

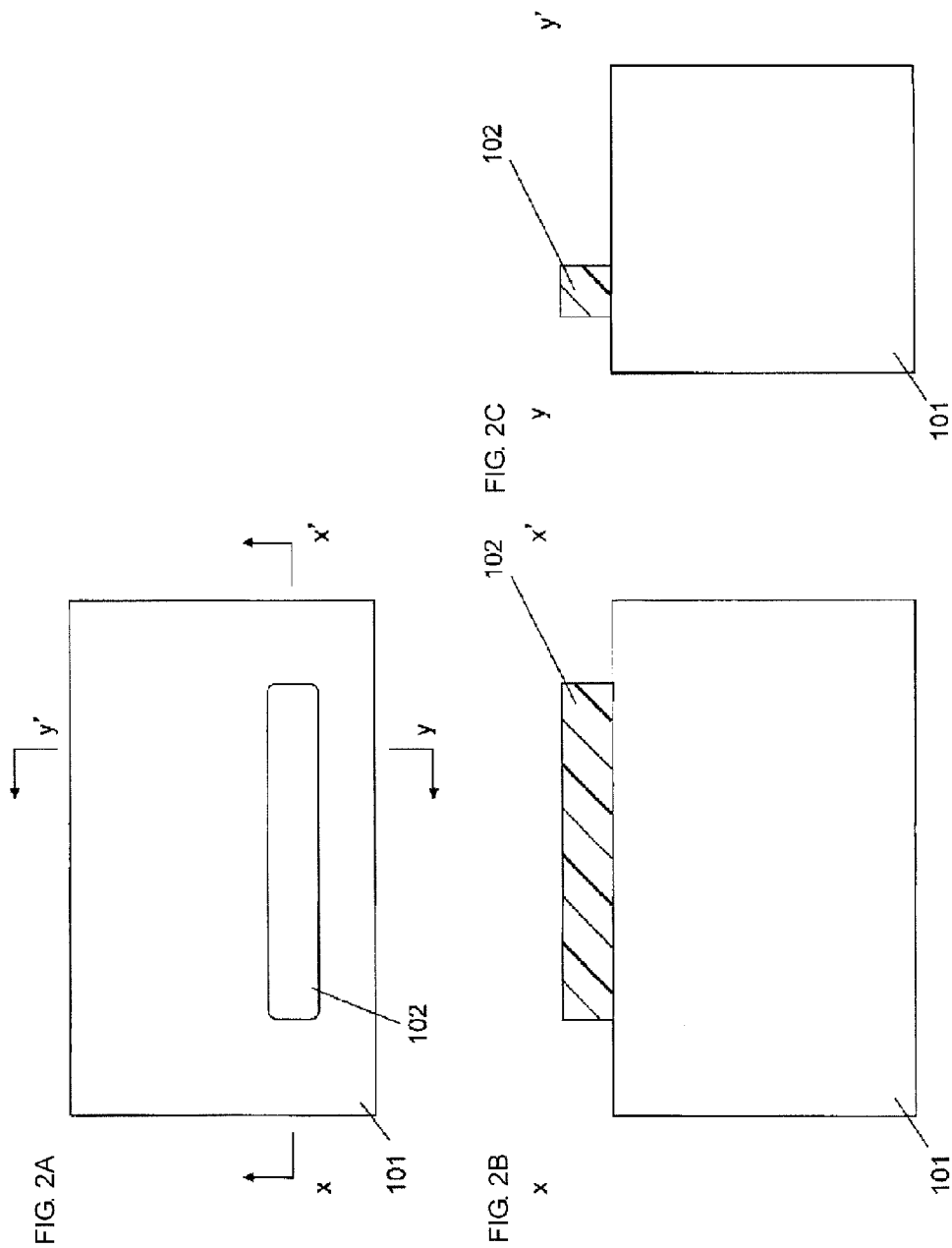

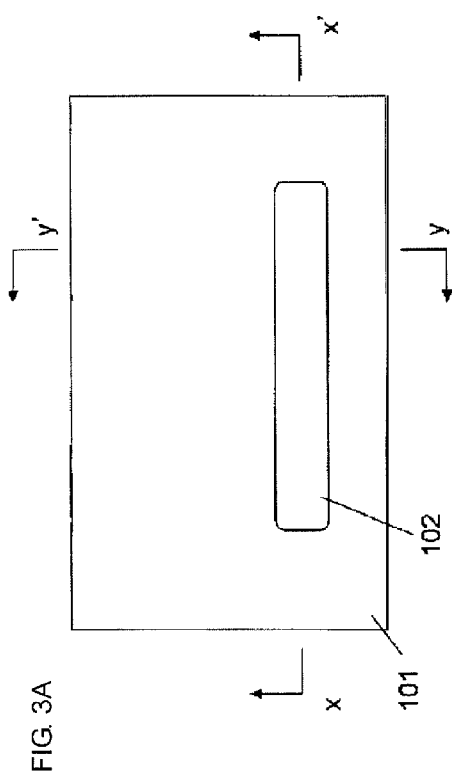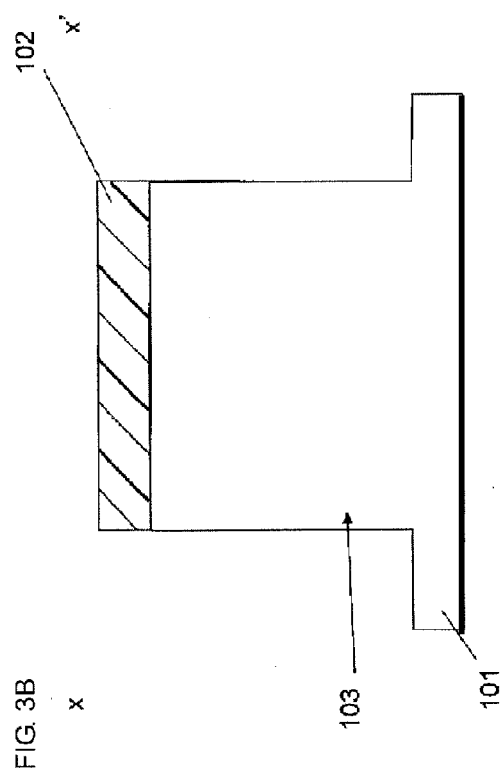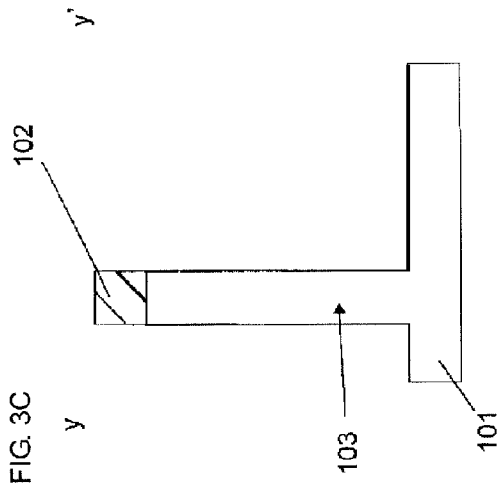

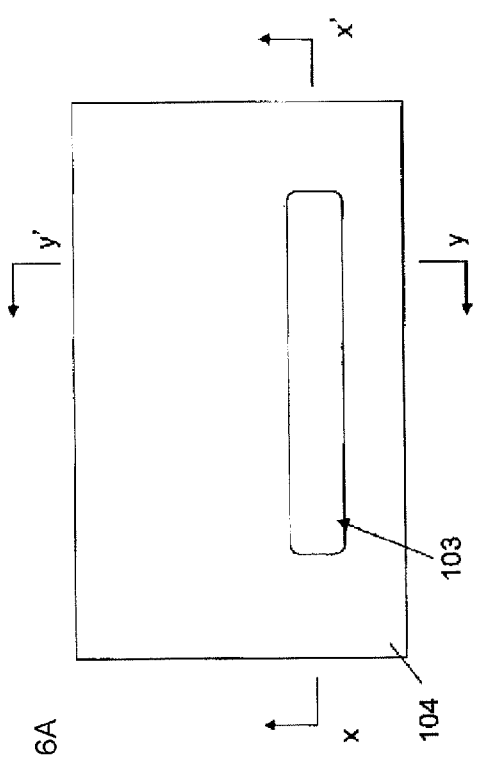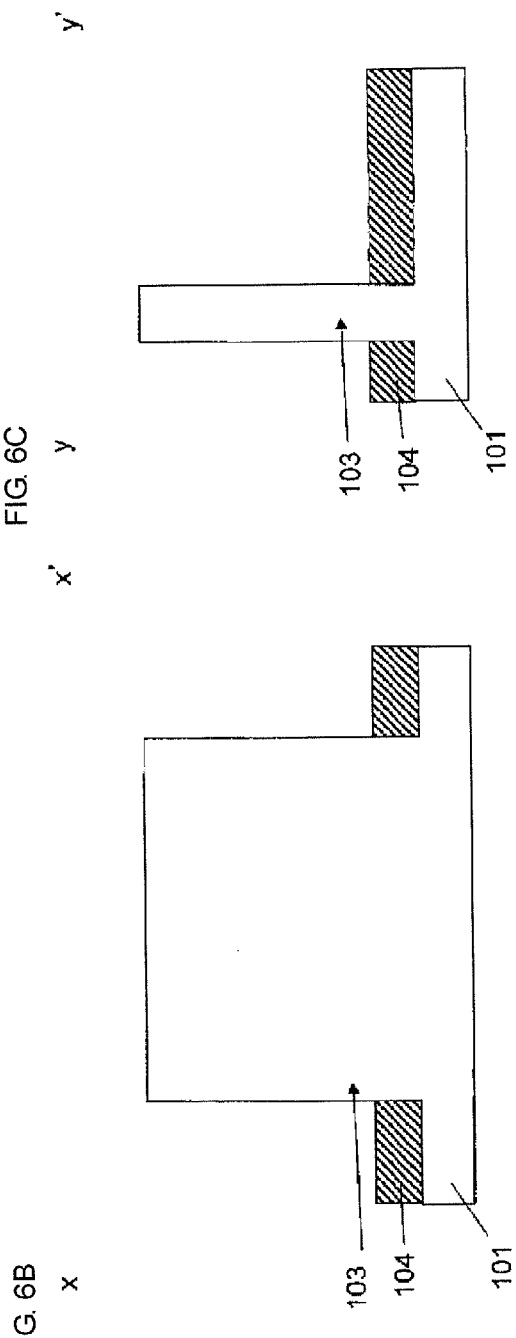

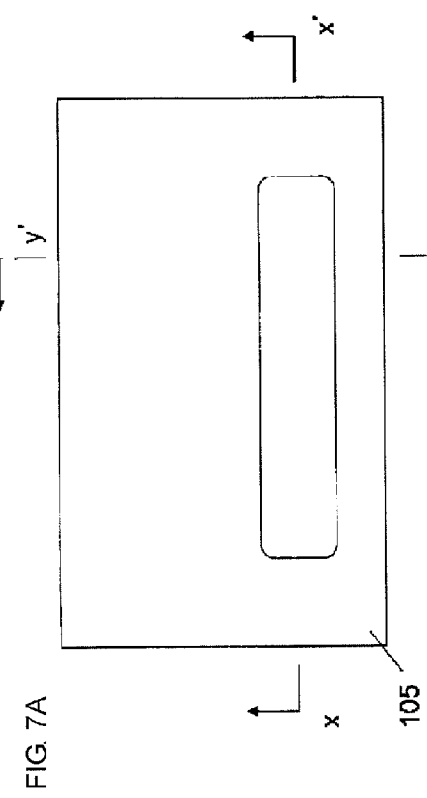
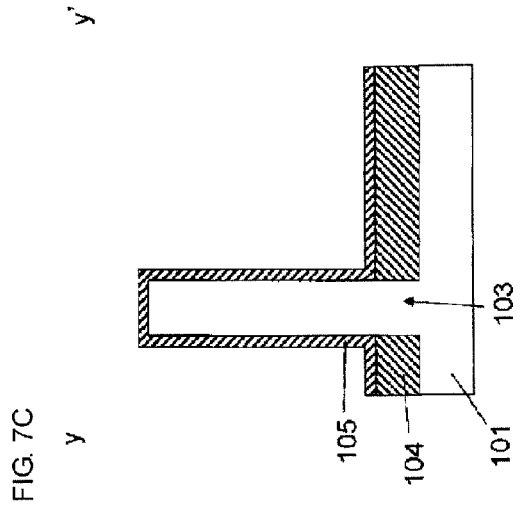
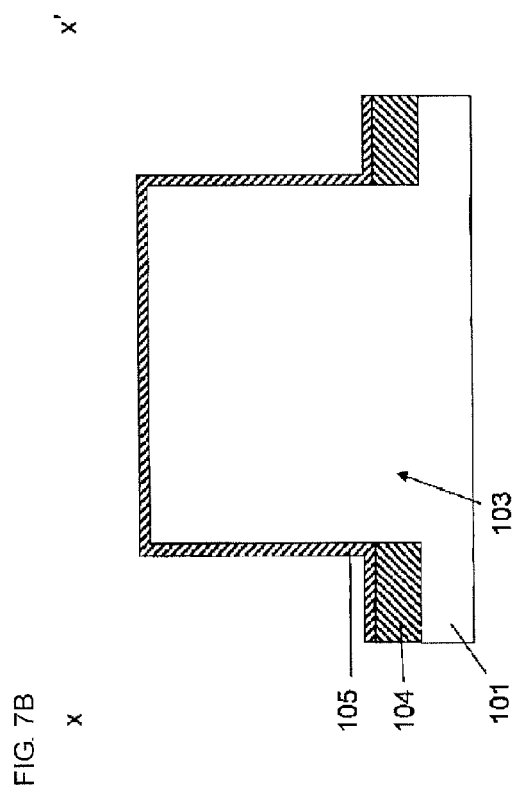
FIG. 7A
FIG. 7B
FIG. 7C

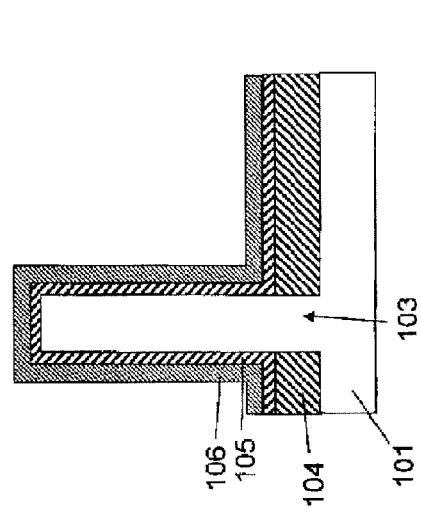
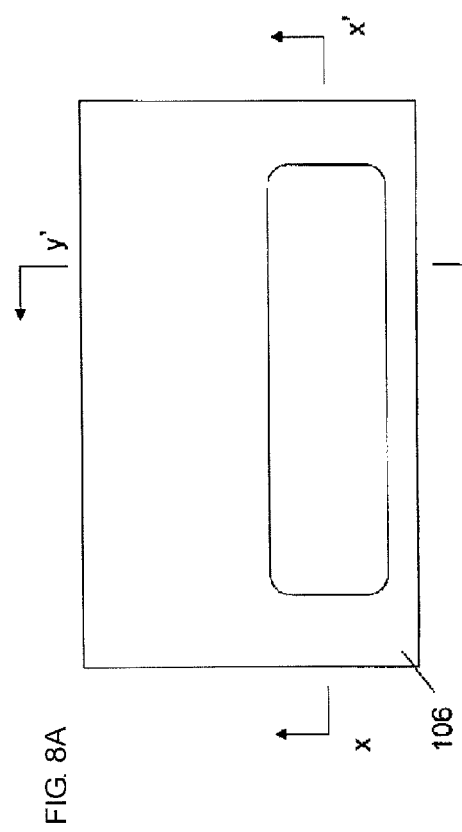
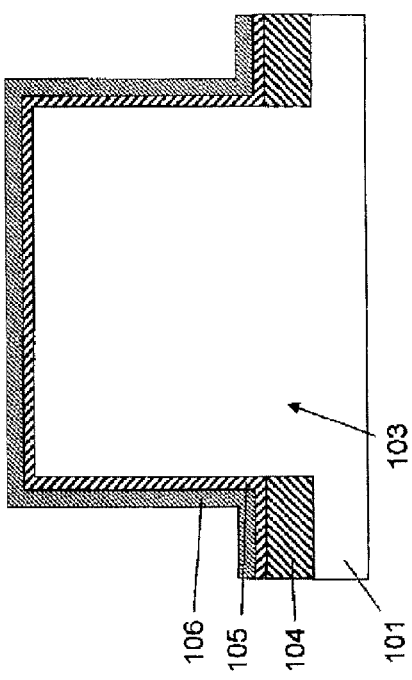
FIG. 8A
FIG. 8B
FIG. 8C

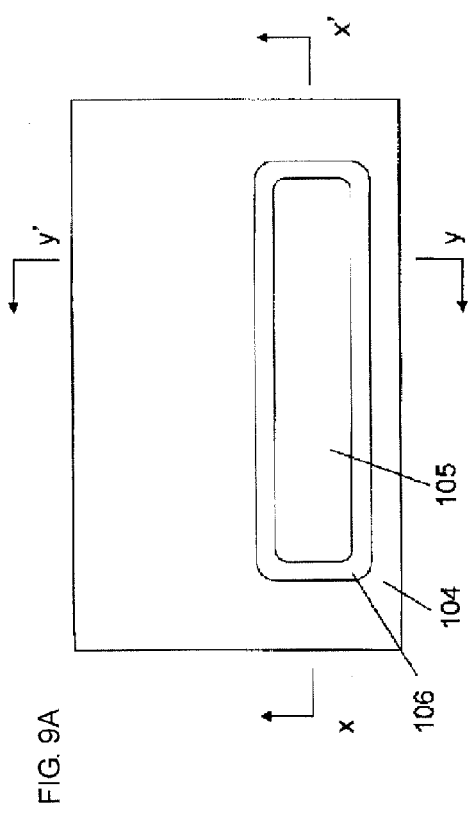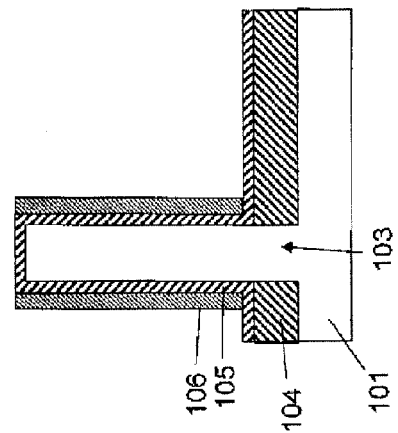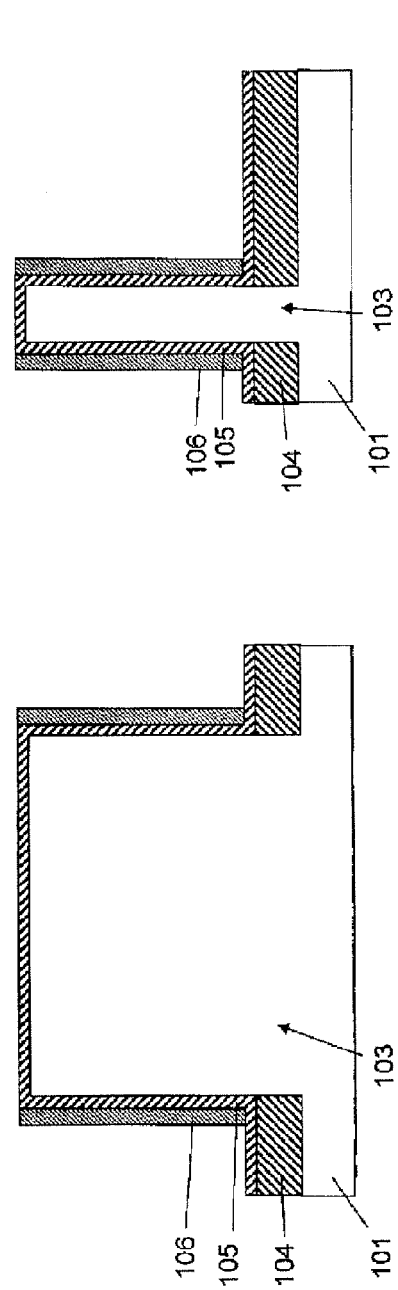

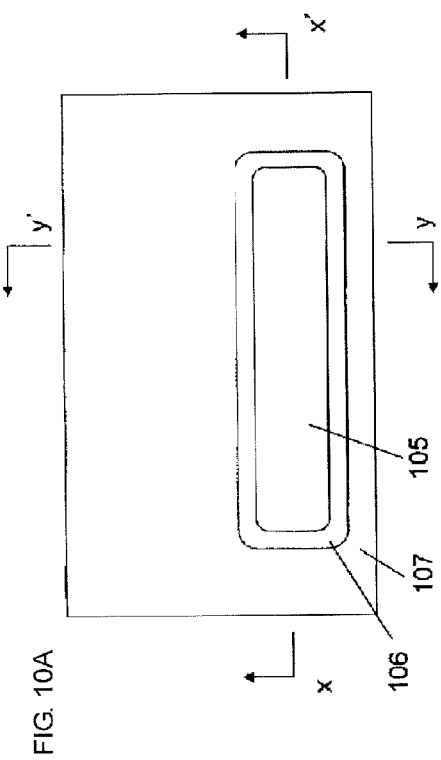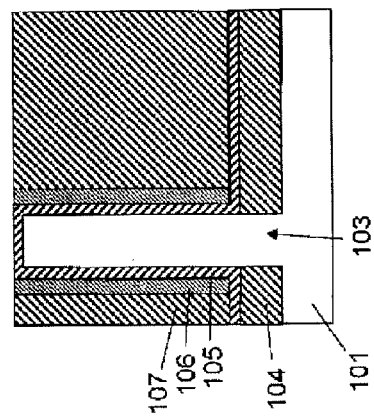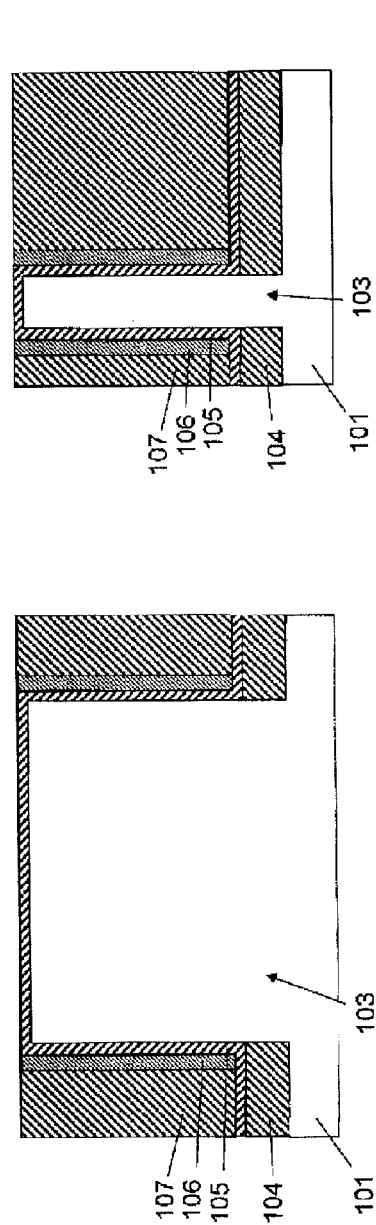

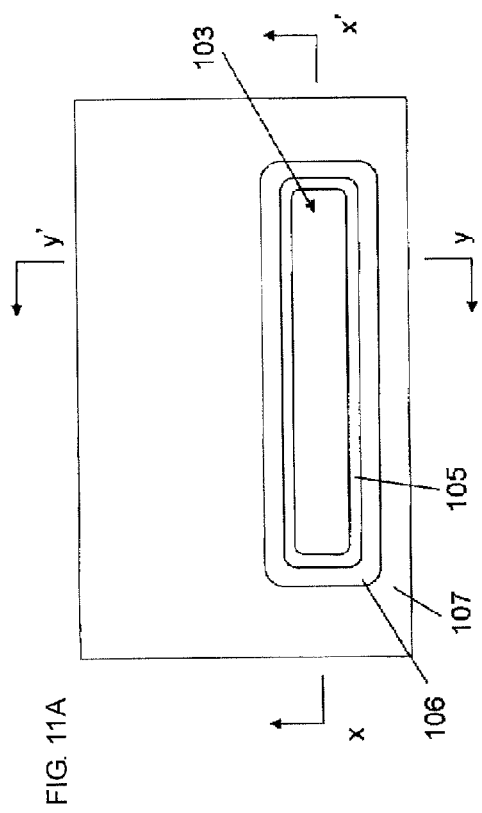
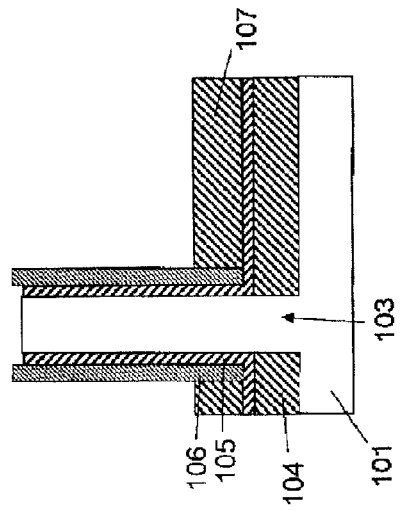
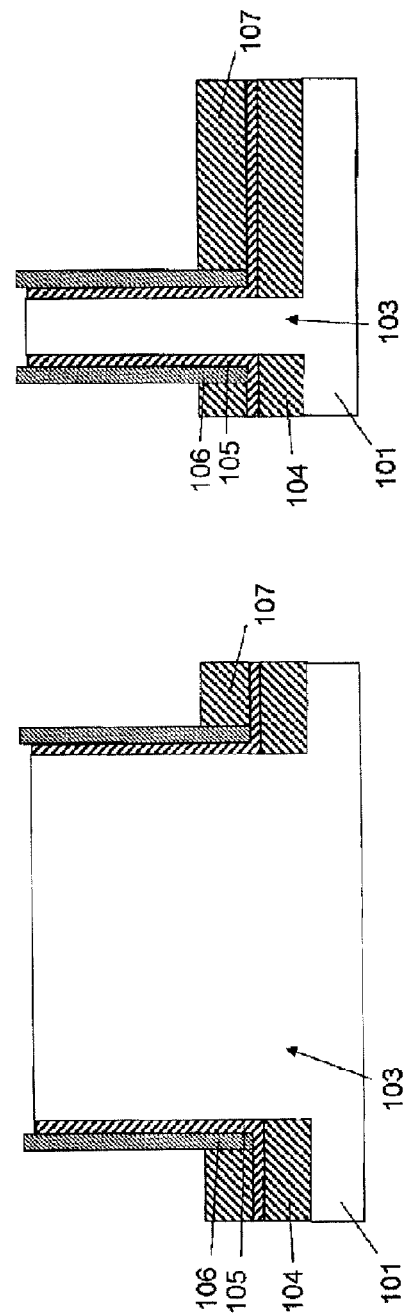
FIG. 11A
FIG. 11B
FIG. 11C

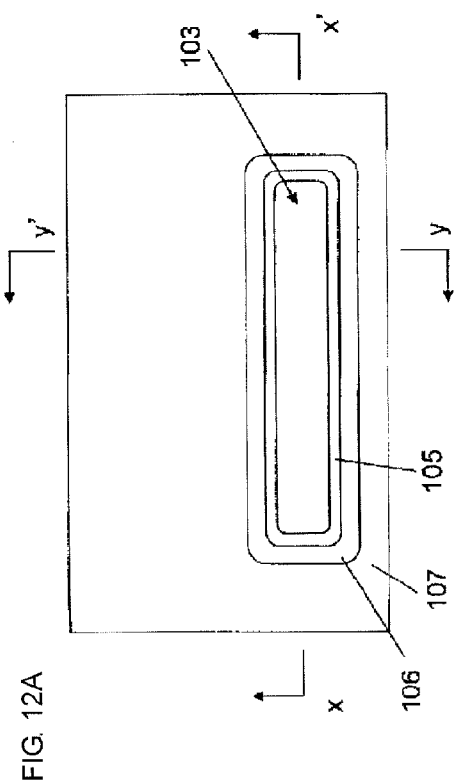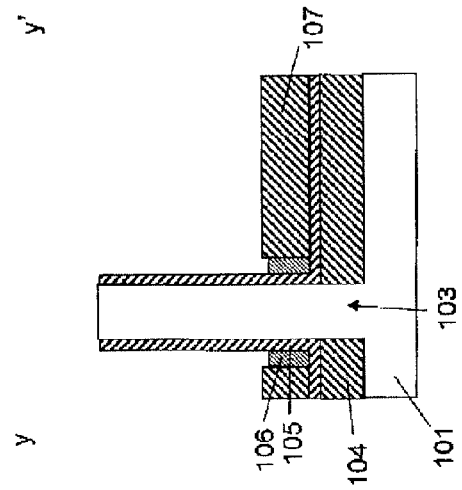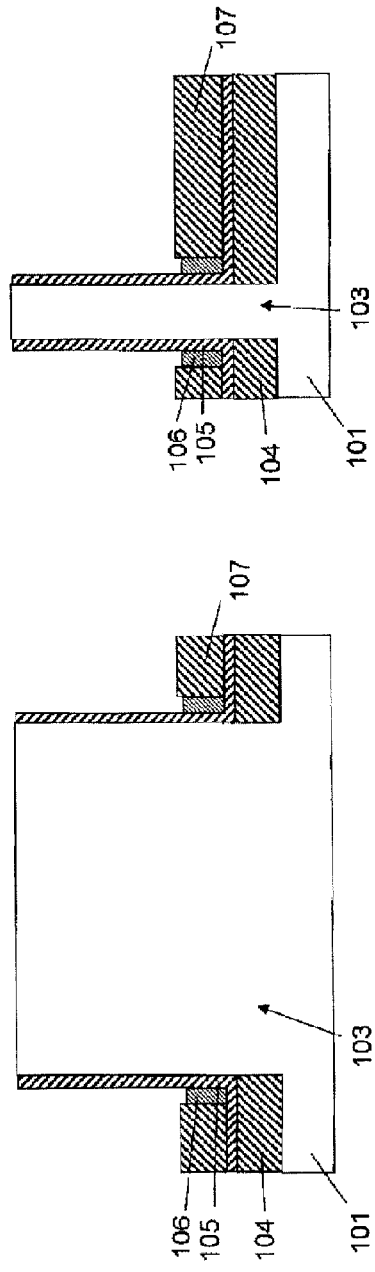
FIG. 12A
FIG. 12B
FIG. 12C

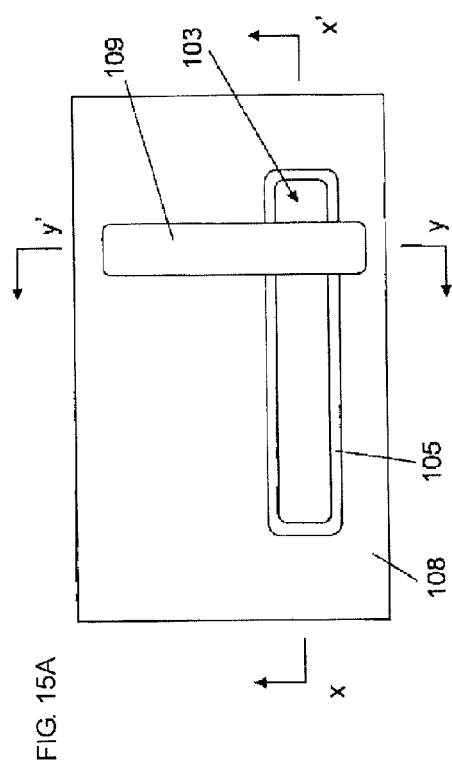
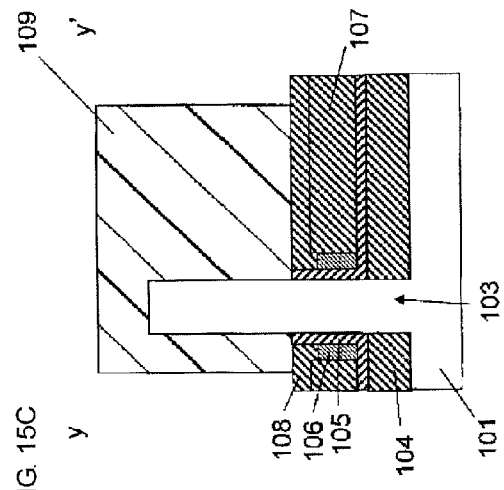
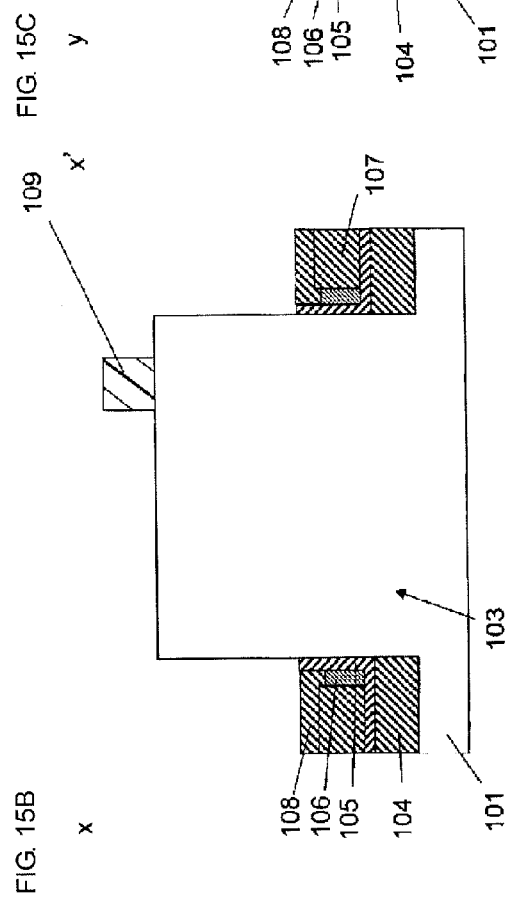
FIG. 15A
FIG. 15B
FIG. 15C

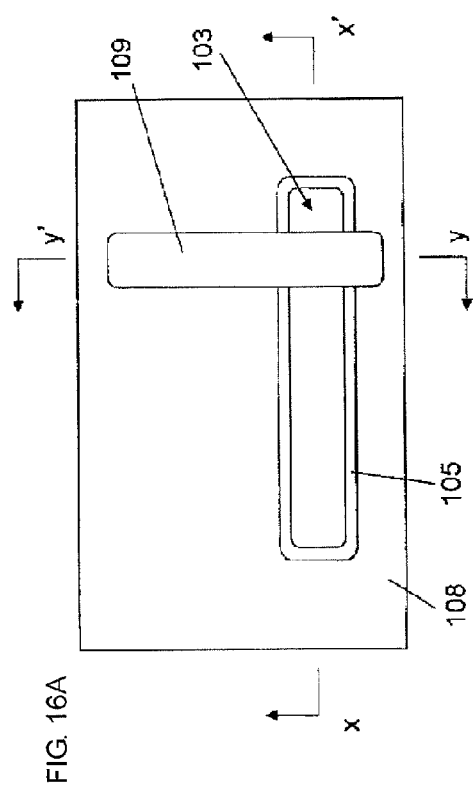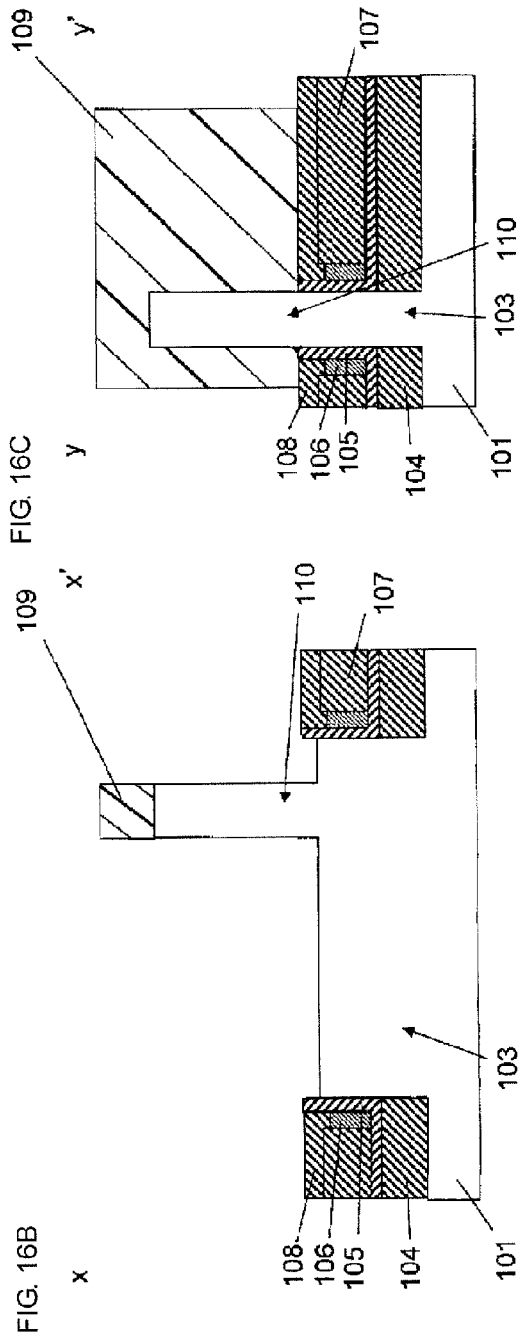

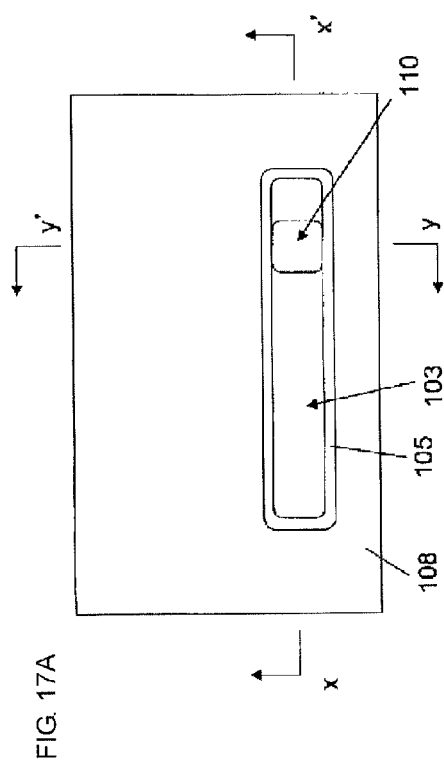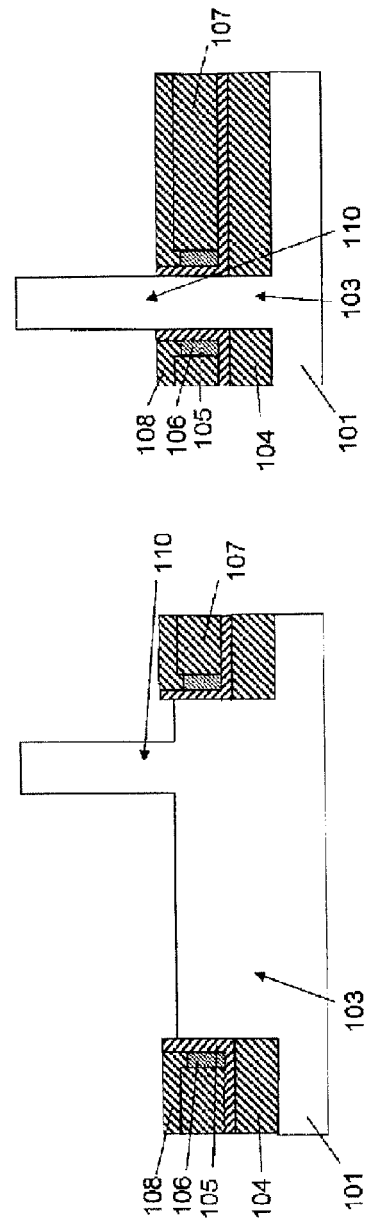

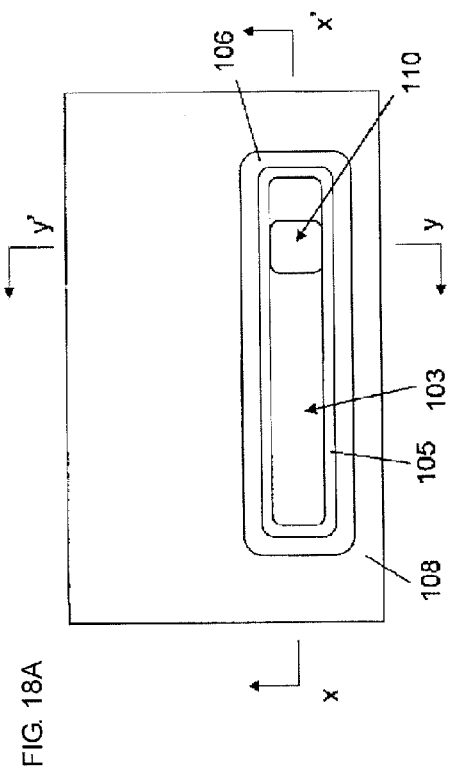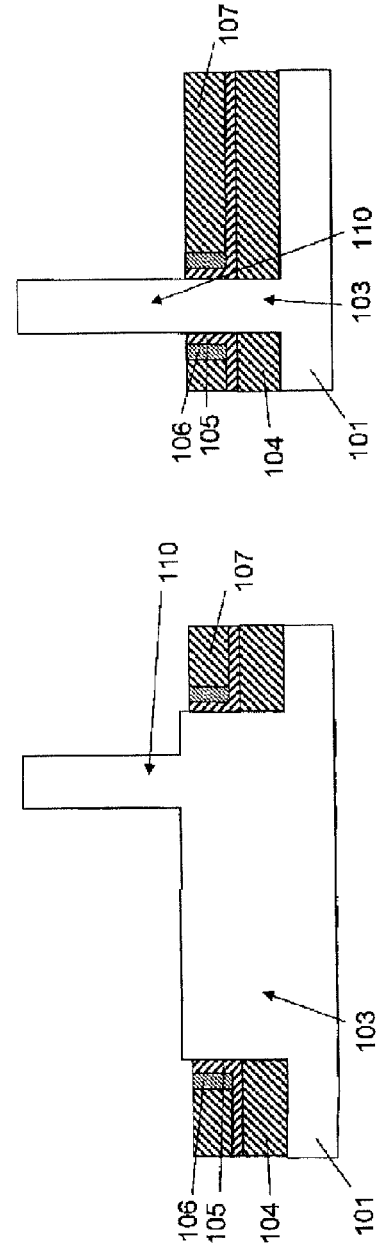
FIG. 18A
FIG. 18B
FIG. 18C

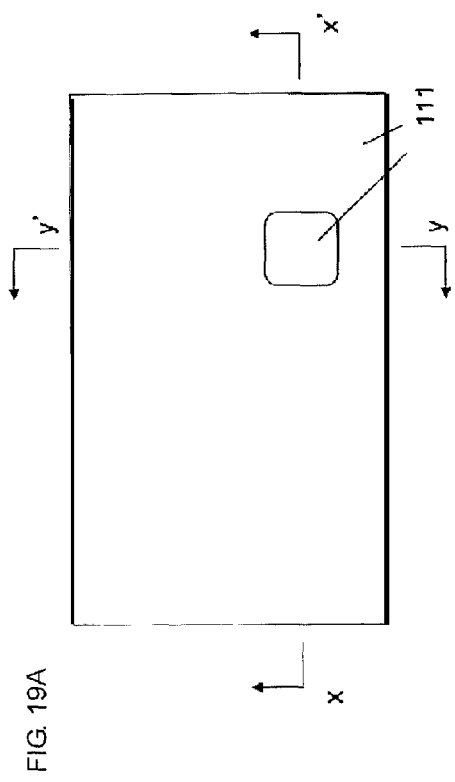
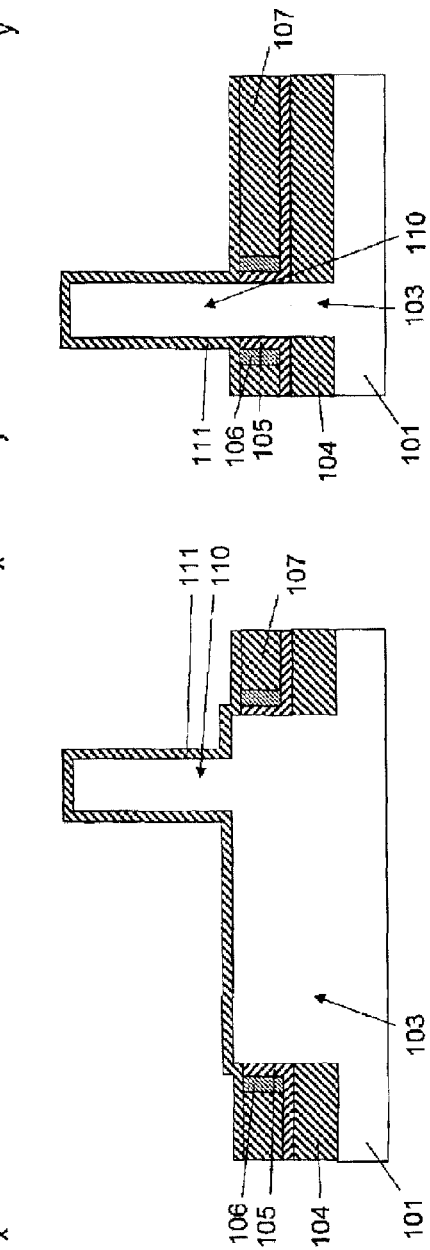
FIG. 19A
FIG. 19B
FIG. 19C

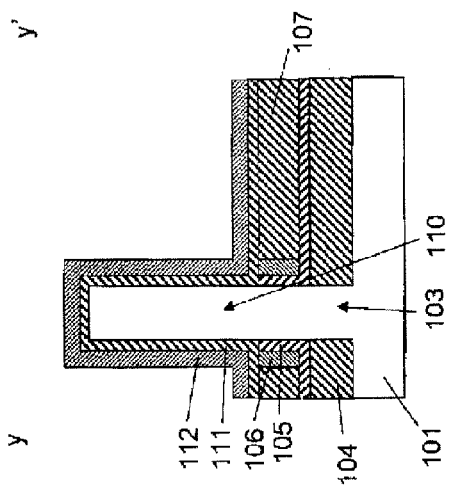
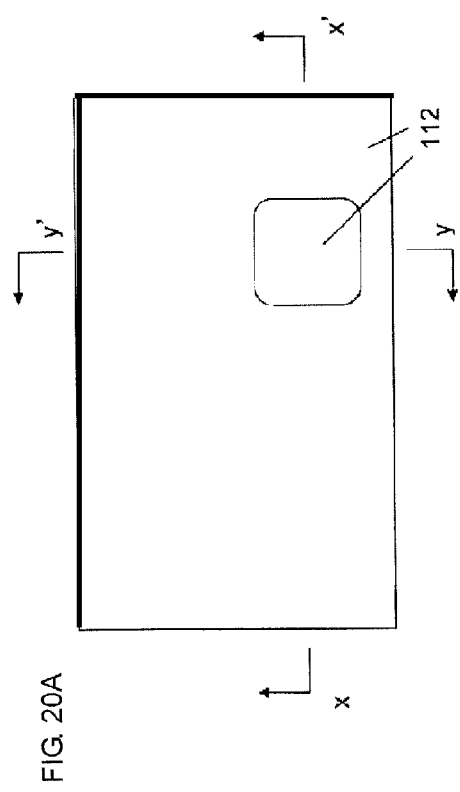
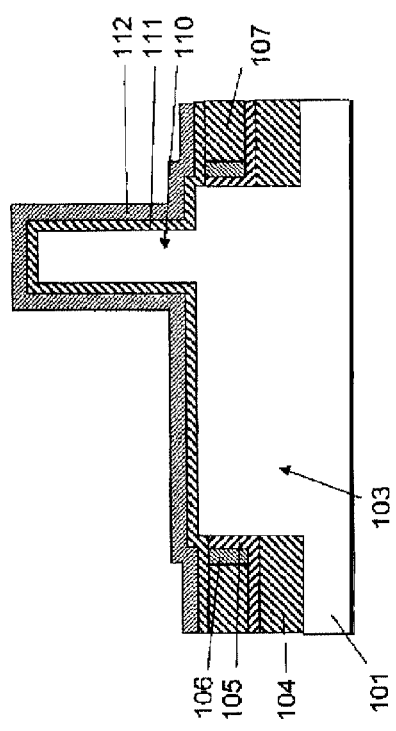
FIG. 20A
FIG. 20B
FIG. 20C

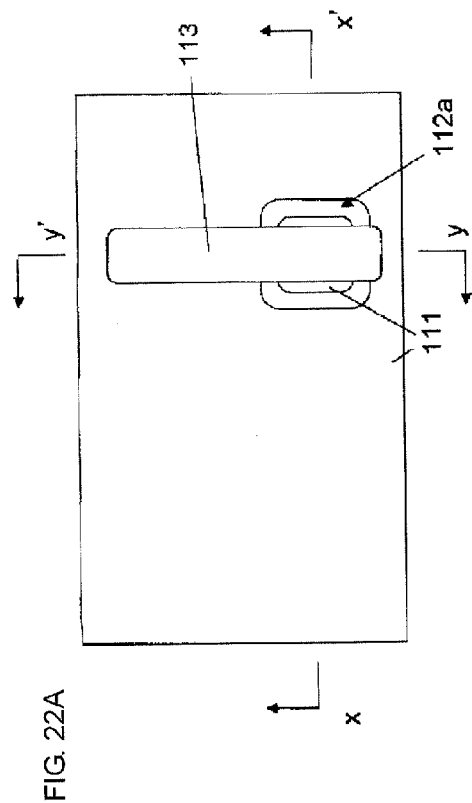
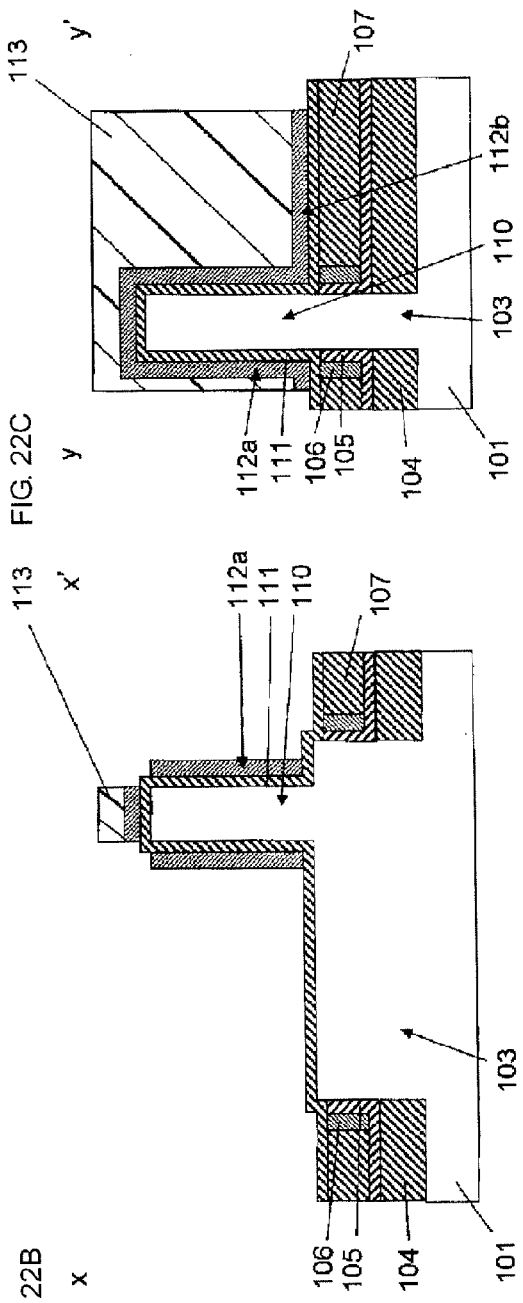
FIG. 22A
FIG. 22B
FIG. 22C

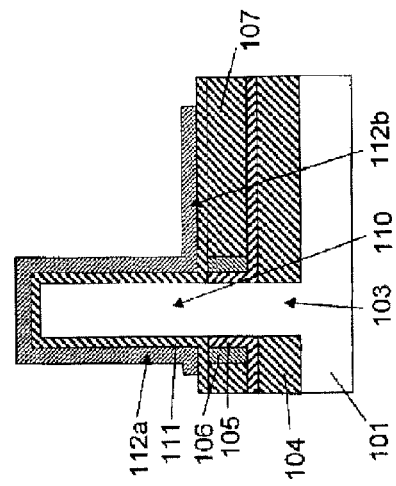
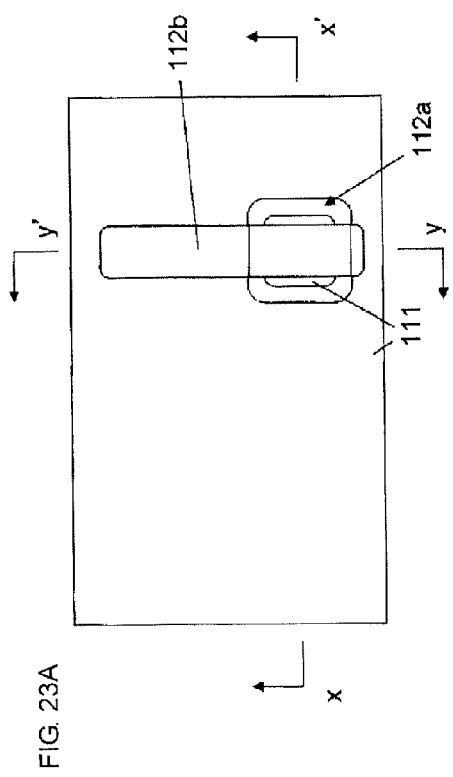
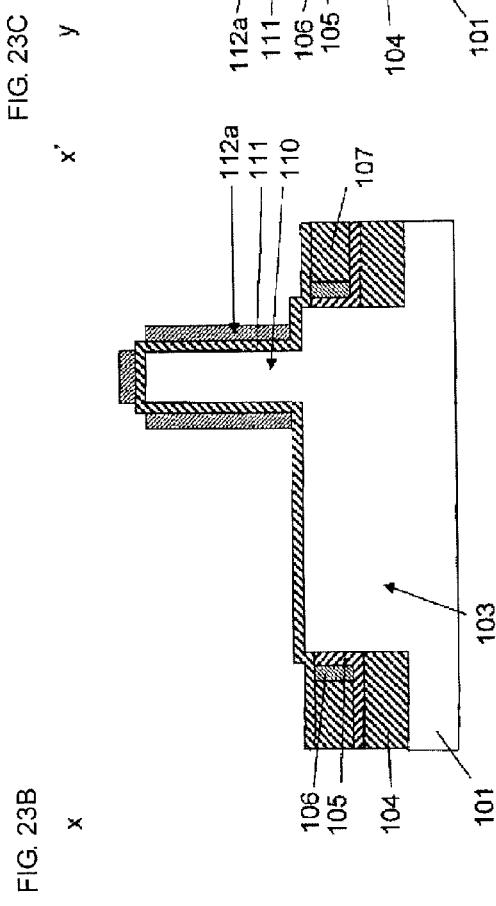

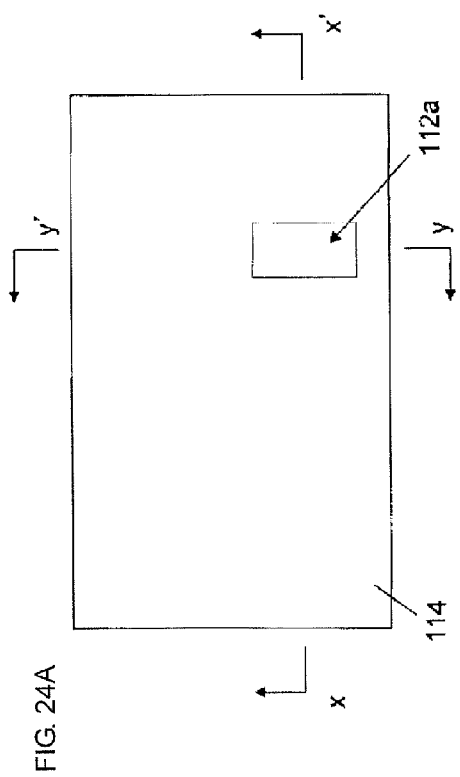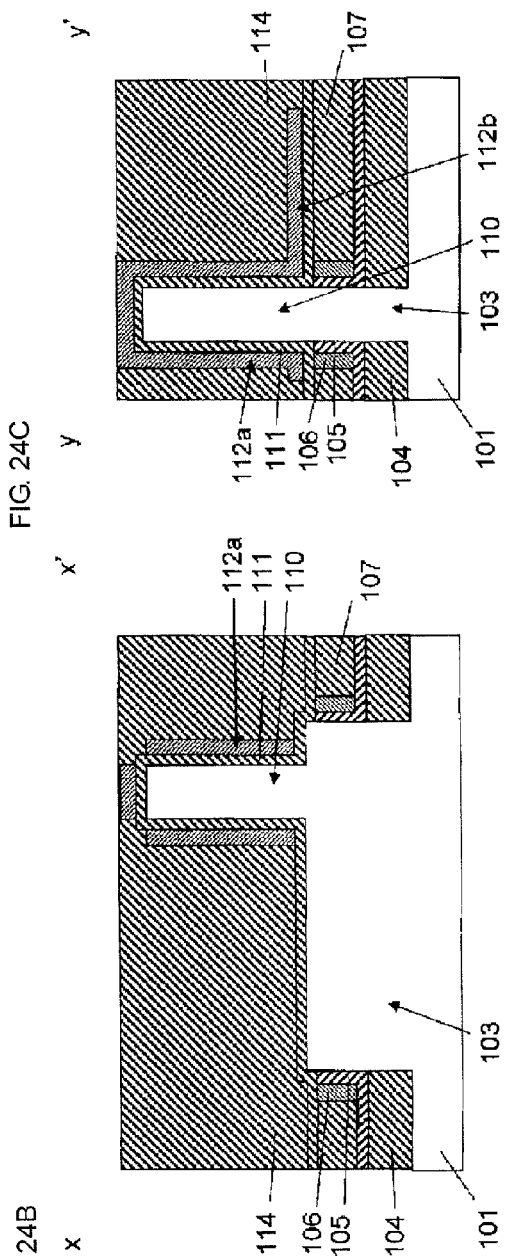

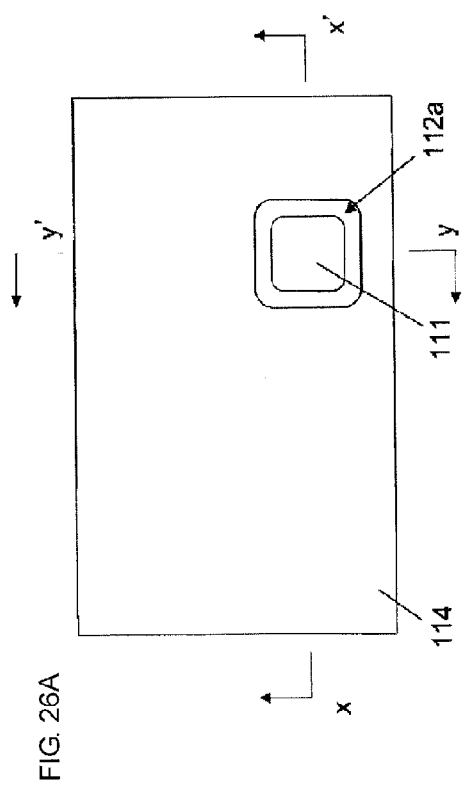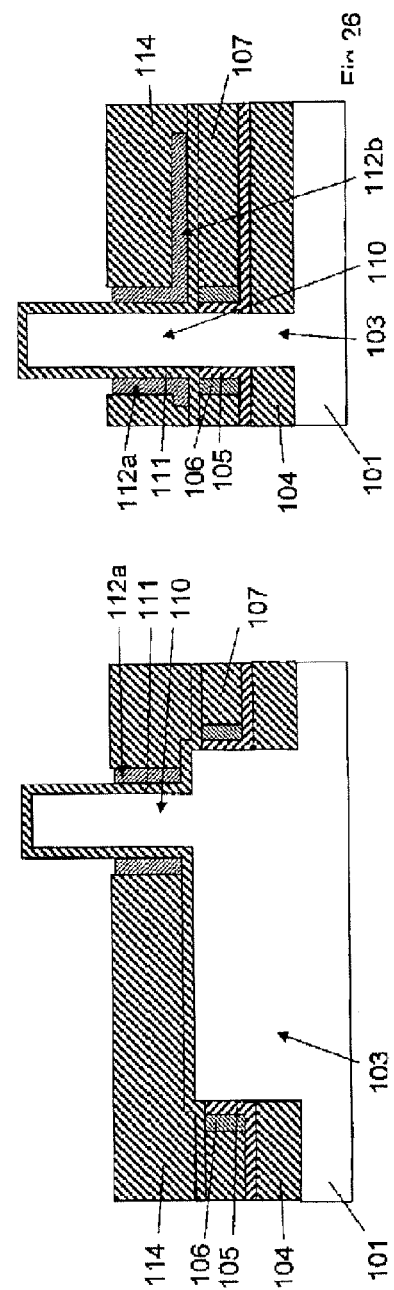

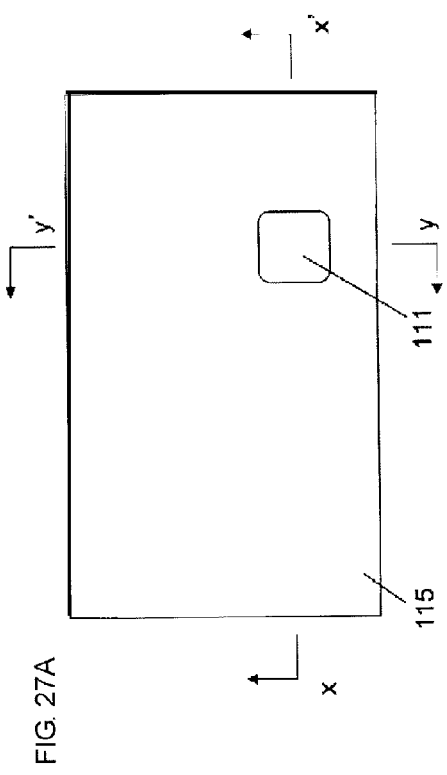
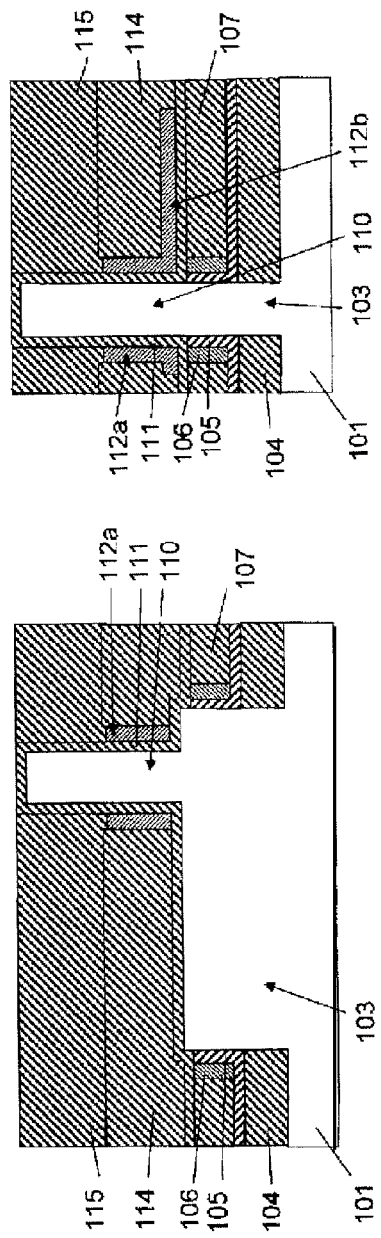
FIG. 27A
FIG. 27B
FIG. 27C

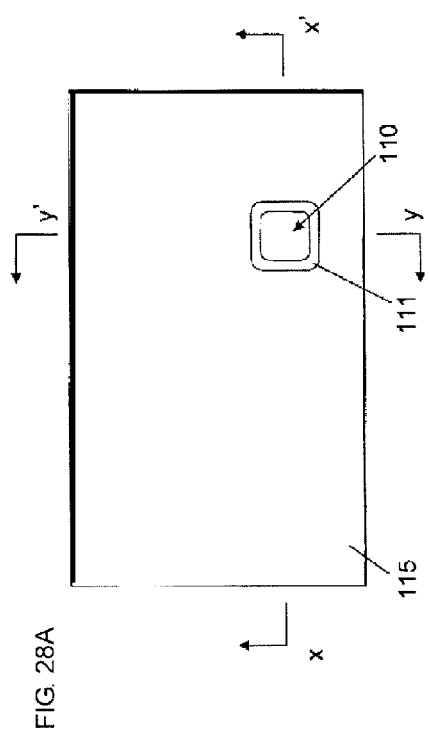
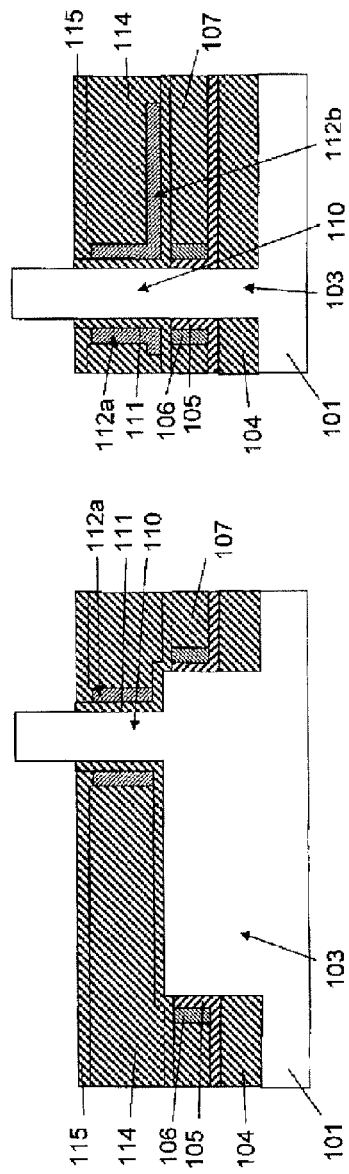
FIG. 28A
FIG. 28B
FIG. 28C

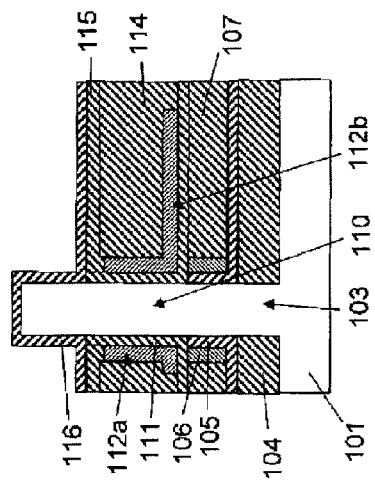
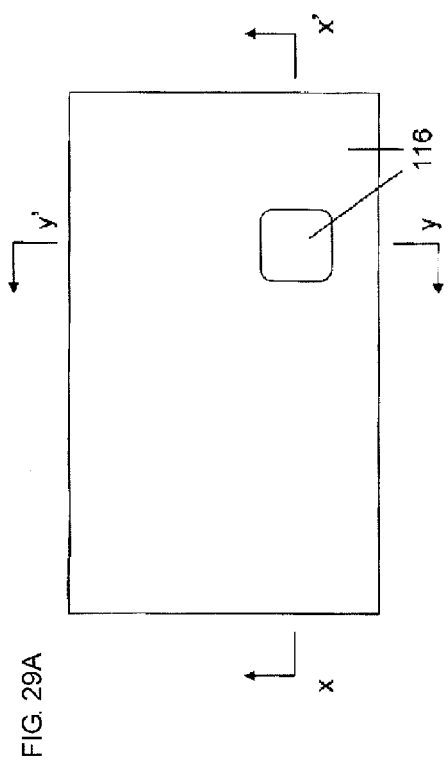
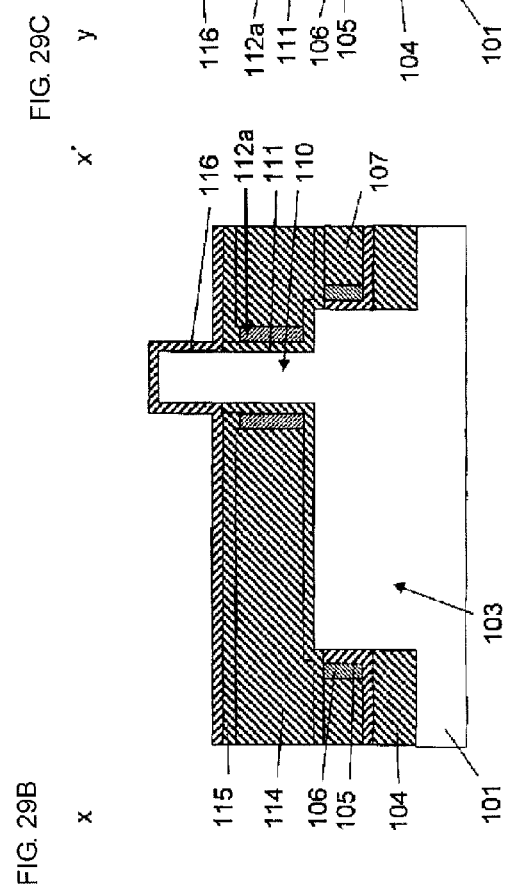
FIG. 29A
FIG. 29B
FIG. 29C

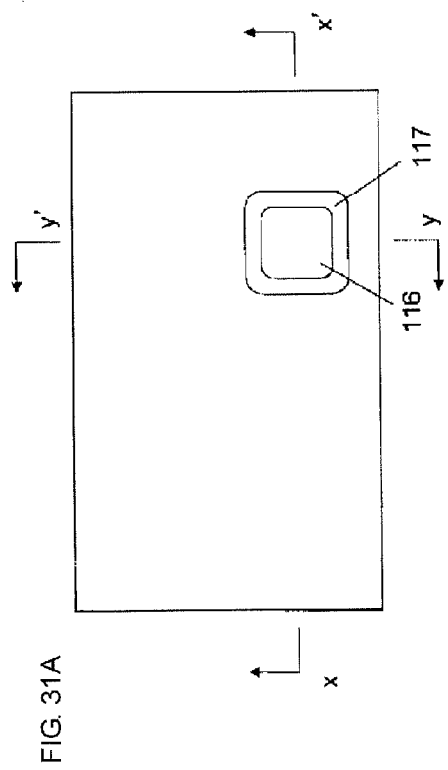
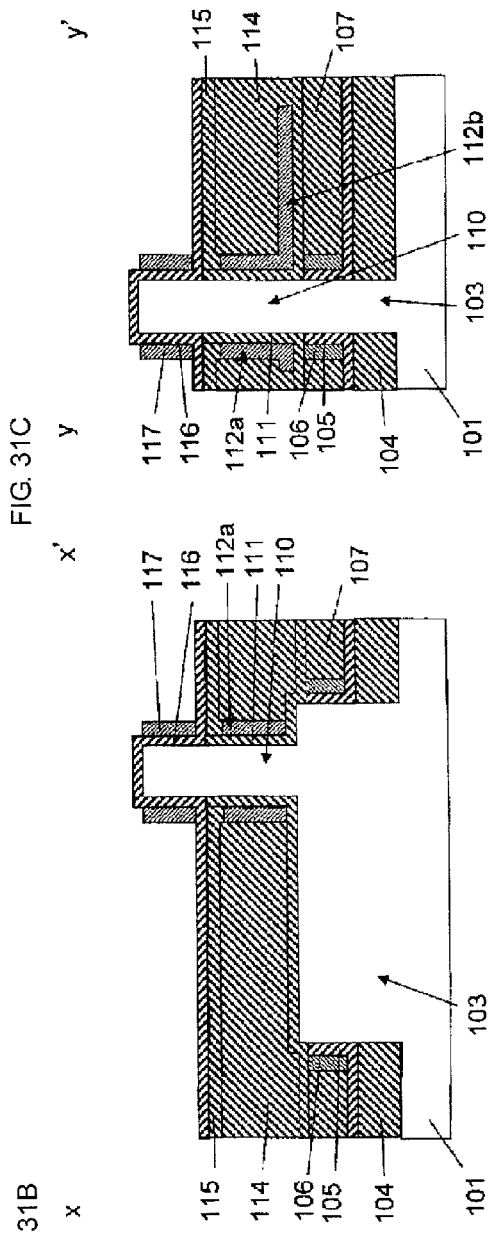
FIG. 31A
FIG. 31B
FIG. 31C

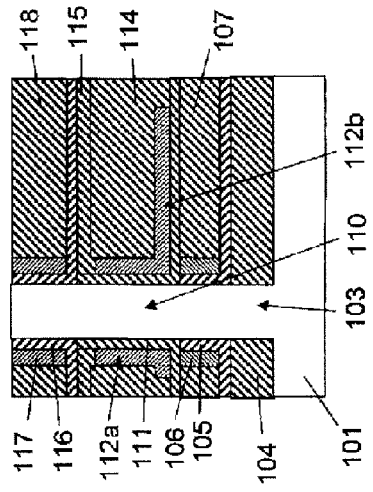
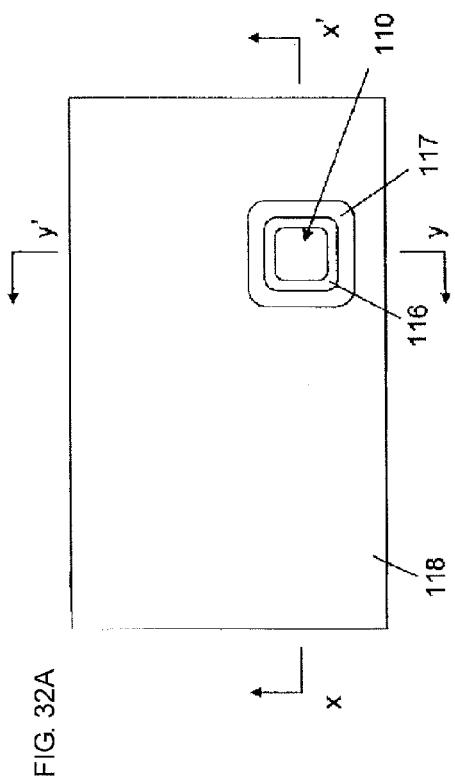
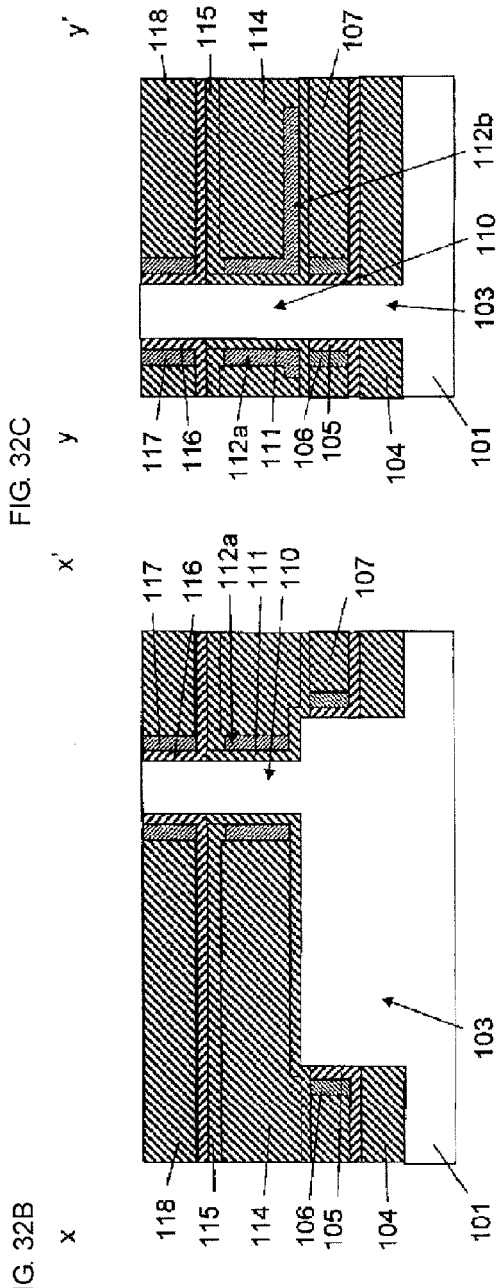

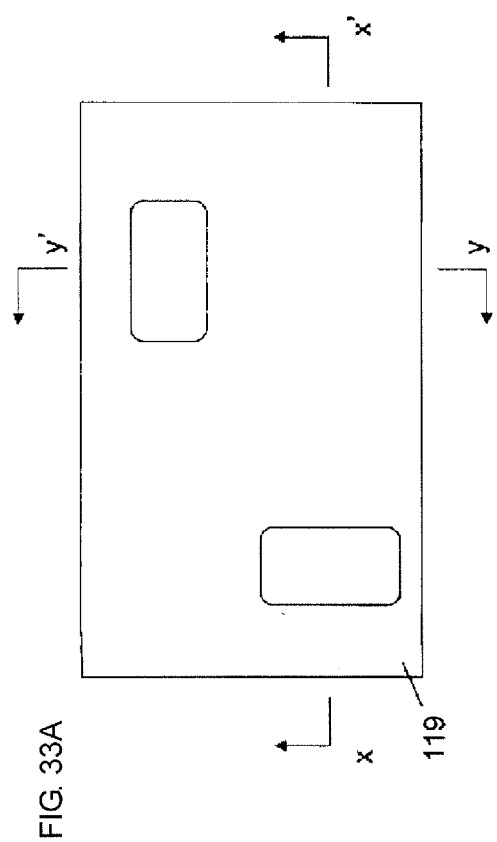
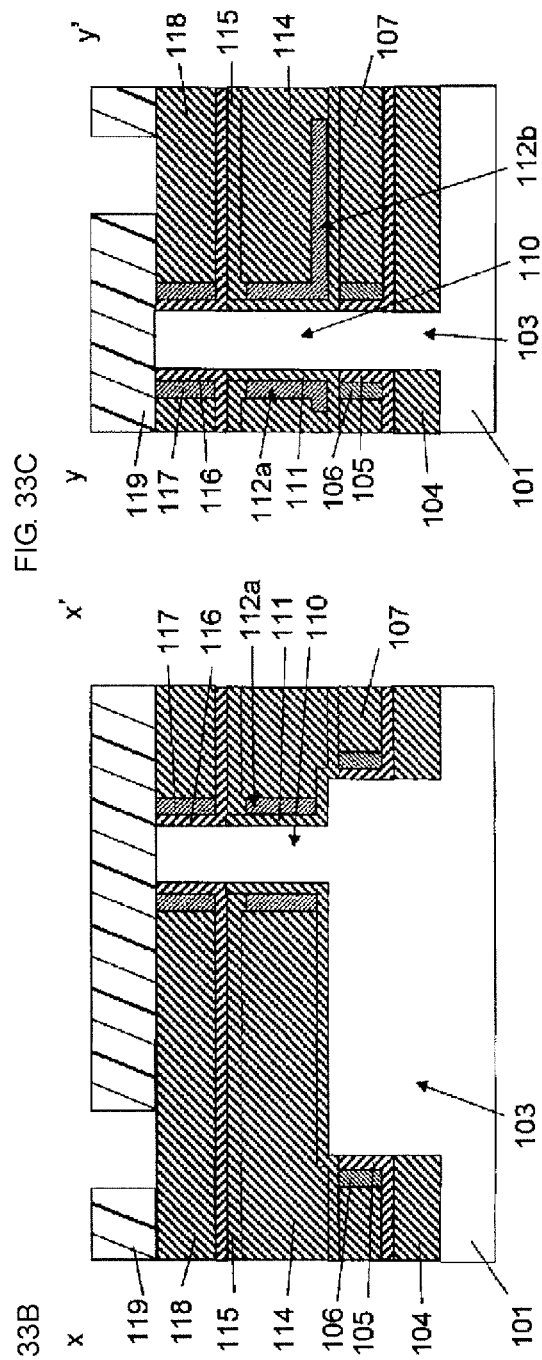
FIG. 33A
FIG. 33B
FIG. 33C

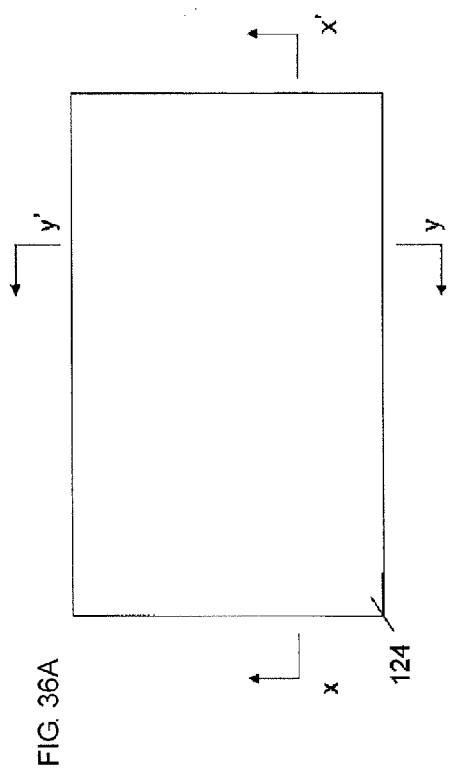
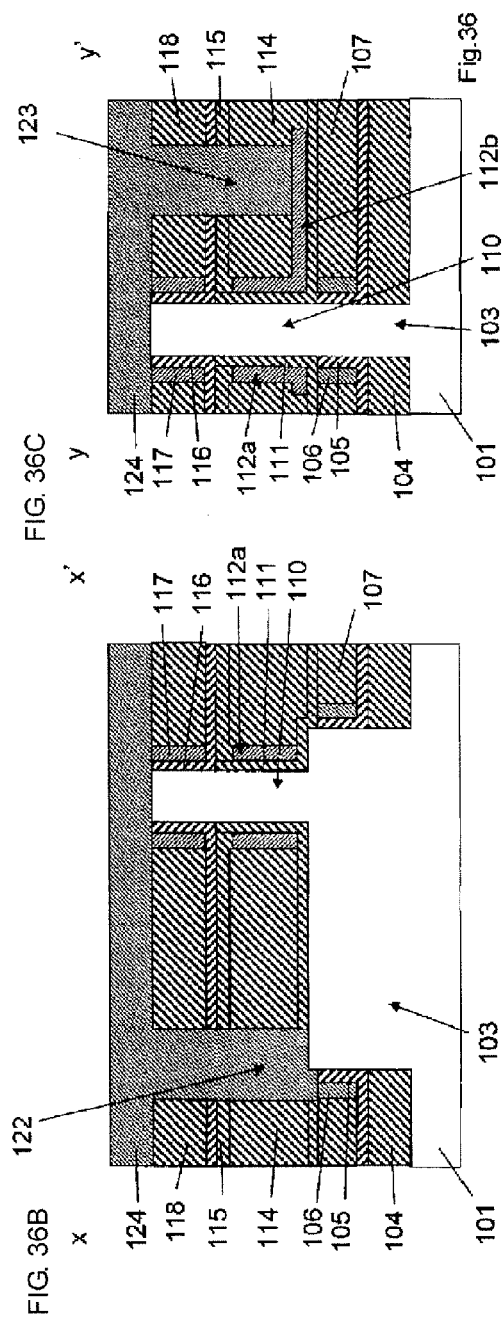
FIG. 36A
FIG. 36B
FIG. 36C

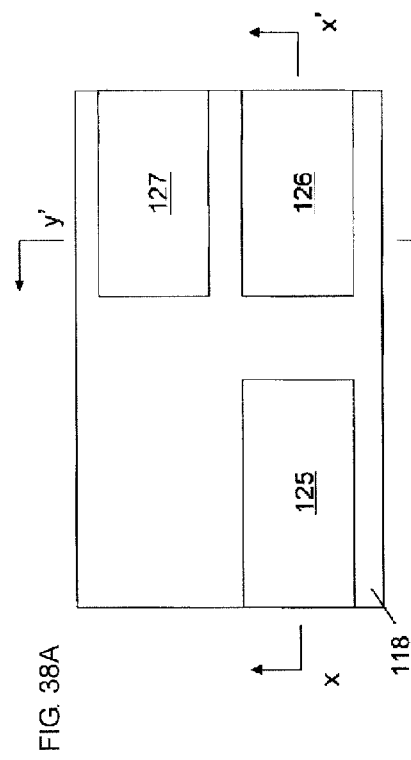
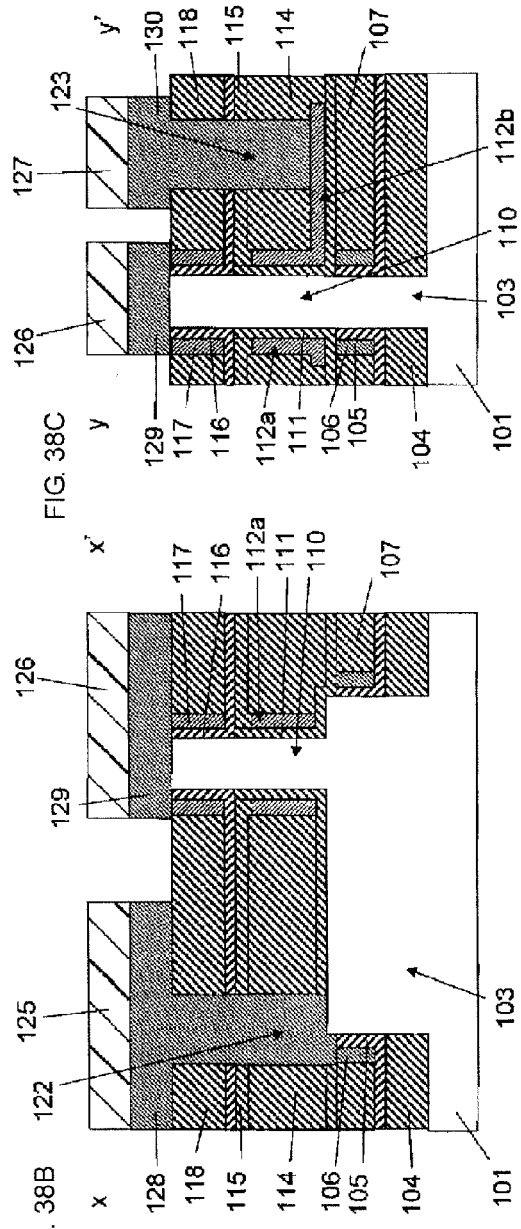
FIG. 38A
FIG. 38B
FIG. 38C

METHOD FOR PRODUCING SEMICONDUCTOR DEVICE AND SEMICONDUCTOR DEVICE

CROSS REFERENCES TO RELATED APPLICATIONS

The present application is a continuation application of PCT/JP2013/061247, filed Apr. 16, 2013, the entire contents of which are incorporated herein by reference.

BACKGROUND OF THE INVENTION

1. Field of the Invention

The present invention relates to a method for producing a semiconductor device and a semiconductor device.

2. Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

As the width of a silicon pillar decreases, it becomes more difficult to make an impurity be present in the silicon pillar because the density of silicon is $5 \times 10^{22}/cm^3$.

In known SGTs, it has been proposed that the channel concentration is set to be a low impurity concentration of $10^{17}$ cm$^{-3}$ or less and the threshold voltage is determined by changing the work function of a gate material (e.g., refer to Japanese Unexamined Patent Application Publication No. 2004-356314).

It has been disclosed that, in planar MOS transistors, the sidewall of an LDD region is formed of a polycrystalline silicon having the same conductivity type as a low-concentration layer, surface carriers of the LDD region are induced by the difference in work function, and thus the impedance of the LDD region can be reduced compared with LDD MOS transistors with an oxide film sidewall (e.g., refer to Japanese Unexamined Patent Application Publication No. 11-297984). It has also been disclosed that the polycrystalline silicon sidewall is electrically insulated from a gate electrode. The drawings show that the polycrystalline silicon sidewall is insulated from a source and a drain by an interlayer insulating film.

SUMMARY OF THE INVENTION

Accordingly, it is an object of the present invention to provide an SGT having a structure in which a transistor is formed by the difference in work function between metal and semiconductor.

A semiconductor device according to an embodiment of the present invention includes a fin-shaped semiconductor layer formed on a substrate, a first insulating film formed around the fin-shaped semiconductor layer, a first metal film formed around the first insulating film, a pillar-shaped semiconductor layer formed on the fin-shaped semiconductor layer, a gate insulating film formed around the pillar-shaped semiconductor layer, a gate electrode formed around the gate insulating film and made of a third metal, a gate line connected to the gate electrode, a second insulating film formed around a sidewall of an upper portion of the pillar-shaped semiconductor layer, and a second metal film formed around the second insulating film. The upper portion of the pillar-shaped semiconductor layer and the second metal film are connected to each other, and an upper portion of the fin-shaped semiconductor layer and the first metal film are connected to each other.

The fin-shaped and pillar-shaped semiconductor layers may be made of silicon.

The first metal film and the second metal film may have a work function of 4.0 eV to 4.2 eV.

The first metal film and the second metal film may have a work function of 5.0 eV to 5.2 eV.

The pillar-shaped semiconductor layer may have a width equal to a length of a short side of the fin-shaped semiconductor layer.

A method for producing a semiconductor device according to an embodiment of the present invention includes a first step of forming a fin-shaped semiconductor layer on a substrate, forming a first insulating film around the fin-shaped semiconductor layer, and forming a first metal film around the first insulating film; after the first step, a second step of forming a pillar-shaped semiconductor layer on the fin-shaped semiconductor layer; after the second step, a third step of forming a gate insulating film around the pillar-shaped semiconductor layer, and forming a gate electrode around the gate insulating film, the gate electrode being made of a third metal, and a gate line connected to the gate electrode; and after the third step, a fourth step of forming a second insulating film around a sidewall of an upper portion of the pillar-shaped semiconductor layer, and forming a second metal film around the second insulating film.

The first step may include, for example, forming a first resist for forming a fin-shaped semiconductor layer on a semiconductor substrate, etching the semiconductor substrate to form the fin-shaped semiconductor layer, removing the first resist, depositing a fourth insulating film around the fin-shaped semiconductor layer, etching back the fourth insulating film to expose an upper portion of the fin-shaped semiconductor layer, forming the first insulating film around the fin-shaped semiconductor layer and on the fourth insulating film, depositing the first metal film around the first insulating film, etching the first metal film so that the first metal film is left as a sidewall around the fin-shaped semiconductor layer, depositing a fifth insulating film, etching back the fifth insulating film to expose an upper portion of the first metal film, and removing the exposed first metal film.

The second step may include, for example, depositing a sixth insulating film around the fin-shaped semiconductor layer, etching back the sixth insulating film to expose an upper portion of the fin-shaped semiconductor layer, forming a second resist so that the second resist intersects the fin-shaped semiconductor layer perpendicularly, and etching the fin-shaped semiconductor layer and removing the second resist so that a portion in which the second resist intersects the fin-shaped semiconductor layer perpendicularly is formed into the pillar-shaped semiconductor layer.

The third step may include, for example, depositing the gate insulating film around the pillar-shaped semiconductor layer and on the fin-shaped semiconductor layer, depositing a third metal film so that the third metal film covers the gate insulating film, forming a third resist for forming the gate line, etching the third metal film to form the gate line, depositing a seventh insulating film, etching back the seventh insulating film to expose an upper portion of the third metal film, and removing the exposed third metal film.

The fourth step may include, for example, depositing an eighth insulating film on the pillar-shaped semiconductor layer, etching back the eighth insulating film to expose an upper portion of the pillar-shaped semiconductor layer, depositing the second insulating film on the pillar-shaped semiconductor layer, depositing the second metal film so that the second metal film covers the second insulating film, and etching the second metal film so that the second metal film is left as a sidewall around an upper portion of the pillar-shaped semiconductor layer.

The present invention can provide an SGT having a structure in which a transistor is formed by the difference in work function between metal and semiconductor.

The fin-shaped semiconductor layer formed on the substrate, the first insulating film formed around the fin-shaped semiconductor layer, and the first metal film formed around the first insulating film provide the difference in work function between the semiconductor layer and a first metal, whereby the fin-shaped semiconductor layer is made to function as an n-type semiconductor layer or a p-type semiconductor layer. For example, when the semiconductor layer is a silicon layer and the first metal film has a work function of 4.0 eV to 4.2 eV, the fin-shaped semiconductor layer functions as an n-type semiconductor layer. On the other hand, when the first metal film has a work function of 5.0 eV to 5.2 eV, the fin-shaped semiconductor layer functions as a p-type semiconductor layer.

The second insulating film formed around a sidewall of an upper portion of the pillar-shaped semiconductor layer and the second metal film formed around the second insulating film provide the difference in work function between the semiconductor layer and a second metal, whereby the upper portion of the pillar-shaped semiconductor layer is made to function as an n-type semiconductor layer or a p-type semiconductor layer. For example, when the semiconductor layer is a silicon layer and the second metal film has a work function of 4.0 eV to 4.2 eV, the upper portion of the pillar-shaped semiconductor layer functions as an n-type semiconductor layer. On the other hand, when the second metal film has a work function of 5.0 eV to 5.2 eV, the upper portion of the pillar-shaped semiconductor layer functions as a p-type semiconductor layer.

A transistor can be operated in a state in which an impurity is not present in a pillar-shaped silicon. Therefore, an impurity-implanting step and a high-temperature heating step for forming a diffusion layer are not required.

BRIEF DESCRIPTION OF THE DRAWINGS

FIG. 2A is a plan view illustrating a method for producing a semiconductor device according to an embodiment of the present invention, FIG. 2B is a sectional view taken along line X-X' of FIG. 2A, and FIG. 2C is a sectional view taken along line Y-Y' of FIG. 2A.

FIG. 3A is a plan view illustrating a method for producing a semiconductor device according to an embodiment of the present invention, FIG. 3B is a sectional view taken along line X-X' of FIG. 3A, and FIG. 3C is a sectional view taken along line Y-Y' of FIG. 3A.

FIG. 6A is a plan view illustrating a method for producing a semiconductor device according to an embodiment of the present invention, FIG. 6B is a sectional view taken along line X-X' of FIG. 6A, and FIG. 6C is a sectional view taken along line Y-Y' of FIG. 6A.

FIG. 7A is a plan view illustrating a method for producing a semiconductor device according to an embodiment of the present invention, FIG. 7B is a sectional view taken along line X-X' of FIG. 7A, and FIG. 7C is a sectional view taken along line Y-Y' of FIG. 7A.

FIG. 8A is a plan view illustrating a method for producing a semiconductor device according to an embodiment of the present invention, FIG. 8B is a sectional view taken along line X-X' of FIG. 8A, and FIG. 8C is a sectional view taken along line Y-Y' of FIG. 8A.

FIG. 9A is a plan view illustrating a method for producing a semiconductor device according to an embodiment of the present invention, FIG. 9B is a sectional view taken along line X-X' of FIG. 9A, and FIG. 9C is a sectional view taken along line Y-Y' of FIG. 9A.

FIG. 10A is a plan view illustrating a method for producing a semiconductor device according to an embodiment of the present invention, FIG. 10B is a sectional view taken along line X-X' of FIG. 10A, and FIG. 10C is a sectional view taken along line Y-Y' of FIG. 11A.

FIG. 11A is a plan view illustrating a method for producing a semiconductor device according to an embodiment of the present invention, FIG. 11B is a sectional view taken along line X-X' of FIG. 11A, and FIG. 11C is a sectional view taken along line Y-Y' of FIG. 11A.

FIG. 12A is a plan view illustrating a method for producing a semiconductor device according to an embodiment of the present invention, FIG. 12B is a sectional view taken along line X-X' of FIG. 12A, and FIG. 12C is a sectional view taken along line Y-Y' of FIG. 12A.

FIG. 15A is a plan view illustrating a method for producing a semiconductor device according to an embodiment of the present invention, FIG. 15B is a sectional view taken along line X-X' of FIG. 15A, and FIG. 15C is a sectional view taken along line Y-Y' of FIG. 15A.

FIG. 16A is a plan view illustrating a method for producing a semiconductor device according to an embodiment of the present invention, FIG. 16B is a sectional view taken along line X-X' of FIG. 16A, and FIG. 16C is a sectional view taken along line Y-Y' of FIG. 16A.

FIG. 17A is a plan view illustrating a method for producing a semiconductor device according to an embodiment of the present invention, FIG. 17B is a sectional view taken along line X-X' of FIG. 17A, and FIG. 17C is a sectional view taken along line Y-Y' of FIG. 17A.

FIG. 18A is a plan view illustrating a method for producing a semiconductor device according to an embodiment of the present invention, FIG. 18B is a sectional view taken along line X-X' of FIG. 18A, and FIG. 18C is a sectional view taken along line Y-Y' of FIG. 18A.

FIG. 19A is a plan view illustrating a method for producing a semiconductor device according to an embodiment of the present invention, FIG. 19B is a sectional view taken along line X-X' of FIG. 19A, and FIG. 19C is a sectional view taken along line Y-Y' of FIG. 19A.

FIG. 20A is a plan view illustrating a method for producing a semiconductor device according to an embodiment of the present invention, FIG. 20B is a sectional view taken along line X-X' of FIG. 20A, and FIG. 20C is a sectional view taken along line Y-Y' of FIG. 20A.

FIG. 22A is a plan view illustrating a method for producing a semiconductor device according to an embodiment of the present invention, FIG. 22B is a sectional view taken along line X-X' of FIG. 22A, and FIG. 22C is a sectional view taken along line Y-Y' of FIG. 22A.

FIG. 23A is a plan view illustrating a method for producing a semiconductor device according to an embodiment of the present invention, FIG. 23B is a sectional view taken along line X-X' of FIG. 23A, and FIG. 23C is a sectional view taken along line Y-Y' of FIG. 23A.

FIG. 24A is a plan view illustrating a method for producing a semiconductor device according to an embodiment of the present invention, FIG. 24B is a sectional view taken along line X-X' of FIG. 24A, and FIG. 24C is a sectional view taken along line Y-Y' of FIG. 24A.

FIG. 26A is a plan view illustrating a method for producing a semiconductor device according to an embodiment of the present invention, FIG. 26B is a sectional view taken along line X-X' of FIG. 26A, and FIG. 26C is a sectional view taken along line Y-Y' of FIG. 26A.

FIG. 27A is a plan view illustrating a method for producing a semiconductor device according to an embodiment of the present invention, FIG. 27B is a sectional view taken along line X-X' of FIG. 27A, and FIG. 27C is a sectional view taken along line Y-Y' of FIG. 27A.

FIG. 28A is a plan view illustrating a method for producing a semiconductor device according to an embodiment of the present invention, FIG. 28B is a sectional view taken along line X-X' of FIG. 28A, and FIG. 28C is a sectional view taken along line Y-Y' of FIG. 28A.

FIG. 29A is a plan view illustrating a method for producing a semiconductor device according to an embodiment of the present invention, FIG. 29B is a sectional view taken along line X-X' of FIG. 29A, and FIG. 29C is a sectional view taken along line Y-Y' of FIG. 29A.

FIG. 31A is a plan view illustrating a method for producing a semiconductor device according to an embodiment of the present invention, FIG. 31B is a sectional view taken along line X-X' of FIG. 31A, and FIG. 31C is a sectional view taken along line Y-Y' of FIG. 31A.

FIG. 32A is a plan view illustrating a method for producing a semiconductor device according to an embodiment of the present invention, FIG. 32B is a sectional view taken along line X-X' of FIG. 32A, and FIG. 32C is a sectional view taken along line Y-Y' of FIG. 32A.

FIG. 33A is a plan view illustrating a method for producing a semiconductor device according to an embodiment of the present invention, FIG. 33B is a sectional view taken along line X-X' of FIG. 33A, and FIG. 33C is a sectional view taken along line Y-Y' of FIG. 33A.

FIG. 36A is a plan view illustrating a method for producing a semiconductor device according to an embodiment of the present invention, FIG. 36B is a sectional view taken along line X-X' of FIG. 36A, and FIG. 36C is a sectional view taken along line Y-Y' of FIG. 36A.

FIG. 38A is a plan view illustrating a method for producing a semiconductor device according to an embodiment of the present invention, FIG. 38B is a sectional view taken along line X-X' of FIG. 38A, and FIG. 38C is a sectional view taken along line Y-Y' of FIG. 38A.

DESCRIPTION OF THE PREFERRED EMBODIMENTS

Figure 1A:
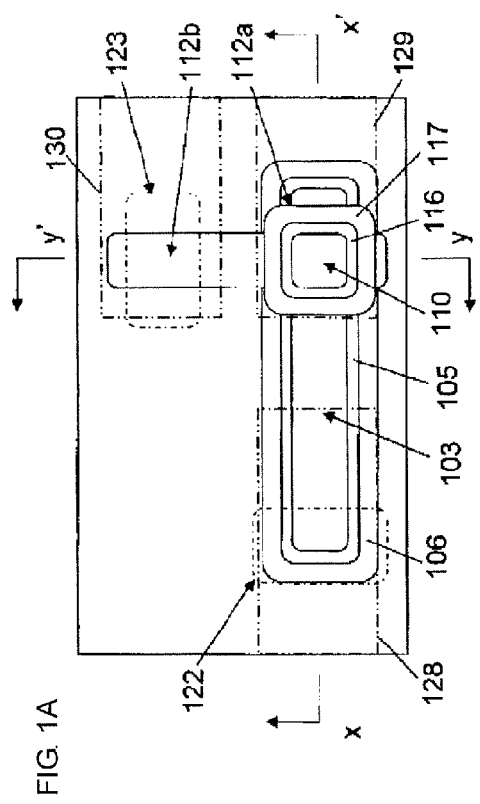
FIG. 1A is a plan view illustrating a semiconductor device according to an embodiment of the present invention.
Figure 1C:
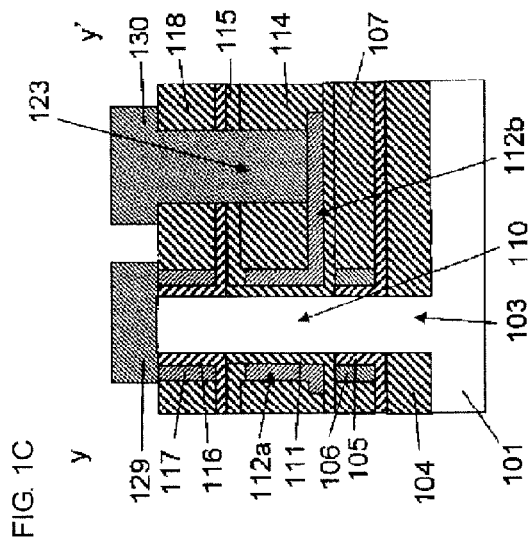
FIG. 1C is a sectional view taken along line Y-Y' of FIG. 1A.
Figure 1B:
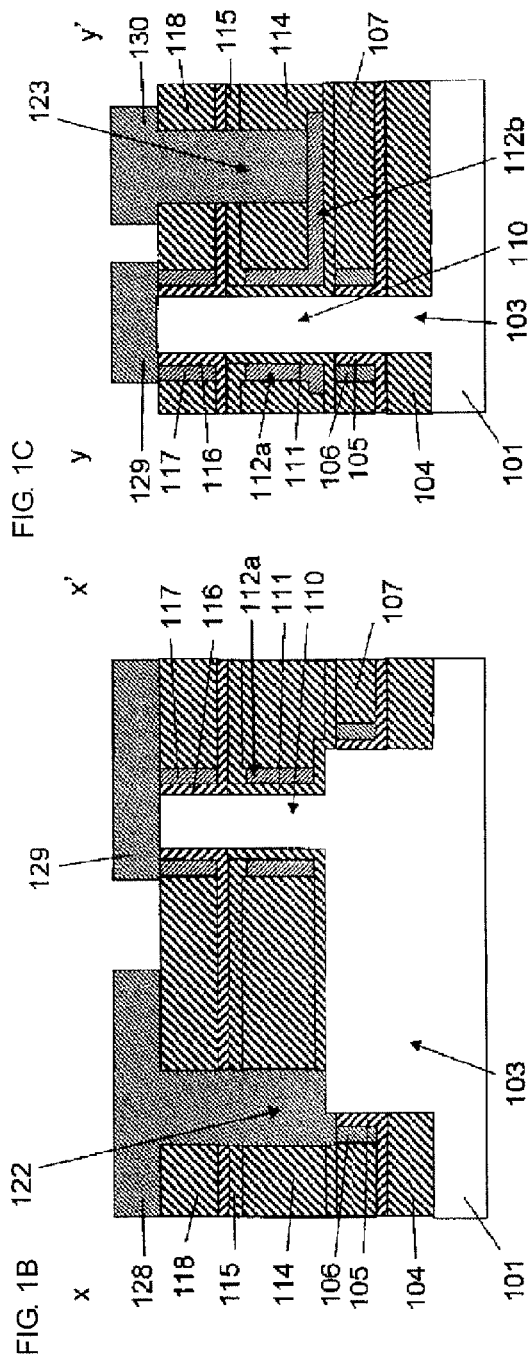
FIG. 1B is a sectional view taken along line X-X' of FIG. 1A.

Hereafter, a semiconductor device having an SGT structure according to an embodiment of the present invention will be described with reference to FIGS. 1A to 1C.

The semiconductor device includes a fin-shaped silicon layer 103 formed on a substrate 101, a first insulating film 105 formed around the fin-shaped silicon layer 103, a first metal film 106 formed around the first insulating film 105, a pillar-shaped silicon layer 110 formed on the fin-shaped silicon layer 103, a gate insulating film 111 formed around the pillar-shaped silicon layer 110, a gate electrode 112a made of a third metal 112 and formed around the gate insulating film 111, a gate line 112b connected to the gate electrode 112a, a second insulating film 116 formed around a sidewall of an upper portion of the pillar-shaped silicon layer 110, and a second metal film 117 formed around the second insulating film 116. An upper portion of the pillar-shaped silicon layer 110 and the second metal film 117 are connected to each other through a metal wiring 129, and an upper portion of the fin-shaped silicon layer 103 and the first metal film 106 are connected to each other through a contact 122.

Therefore, the same potential is applied to the upper portion of the pillar-shaped silicon layer 110 and the second metal film 117. In the upper portion of the pillar-shaped silicon layer 110, carriers are induced by the difference in work function between the second metal film 117 and silicon.

The same potential is applied to the upper portion of the fin-shaped silicon layer 103 and the first metal film 106. In the upper portion of the fin-shaped silicon layer 103, carriers are induced by the difference in work function between the first metal film 106 and silicon.

When the first metal film 106 and the second metal film 117 have a work function of 4.0 eV to 4.2 eV, which is near the work function 4.05 eV of n-type silicon, the upper portion of the pillar-shaped silicon layer 110 and the upper portion of the fin-shaped silicon layer 103 each function as n-type silicon. The first metal film 106 and the second metal film 117 are preferably made of, for example, a compound (TaTi) of tantalum and titanium or tantalum nitride (TaN).

When the first metal film 106 and the second metal film 117 have a work function of 5.0 eV to 5.2 eV, which is near the work function 5.15 eV of p-type silicon, the upper portion of the pillar-shaped silicon layer 110 and the upper portion of the fin-shaped silicon layer 103 each function as p-type silicon. The first metal film 106 and the second metal film 117 are preferably made of, for example, ruthenium (Ru) or titanium nitride (TiN).

Herein, when the third metal 112 has a work function of 4.2 eV to 5.0 eV, the transistor can be operated as an enhancement type transistor.

Thus, the transistor can be operated in a state in which an impurity is not present in a pillar-shaped silicon. Therefore, an impurity-implanting step and a high-temperature heating step for forming a diffusion layer are not required.

Hereafter, a production process for forming an SGT structure according to an embodiment of the present invention will be described with reference to FIG. 2A to FIG. 39C.

A first step of forming a first resist for forming a fin-shaped semiconductor layer on a semiconductor substrate, etching the semiconductor substrate to form the fin-shaped semiconductor layer, removing the first resist, depositing a fourth insulating film around the fin-shaped semiconductor layer, etching back the fourth insulating film to expose an upper portion of the fin-shaped semiconductor layer, forming a first insulating film around the fin-shaped semiconductor layer and on the fourth insulating film, depositing a first metal film around the first insulating film, etching the first metal film so that the first metal film is left as a sidewall around the fin-shaped semiconductor layer, depositing a fifth insulating film, etching back the fifth insulating film to expose an upper portion of the first metal film, and removing the exposed first metal film will be described.

As illustrated in FIGS. 2A to 2C, a first resist 102 for forming a fin-shaped silicon layer 103 is formed on a silicon substrate 101. In this example, a silicon substrate is used, but any semiconductor substrate other than the silicon substrate may be used.

As illustrated in FIGS. 3A to 3C, the silicon substrate 101 is etched to form a fin-shaped silicon layer 103. Herein, the fin-shaped silicon layer is formed using the resist as a mask, but a hard mask such as an oxide film or a nitride film may be used.

Figure 4A:
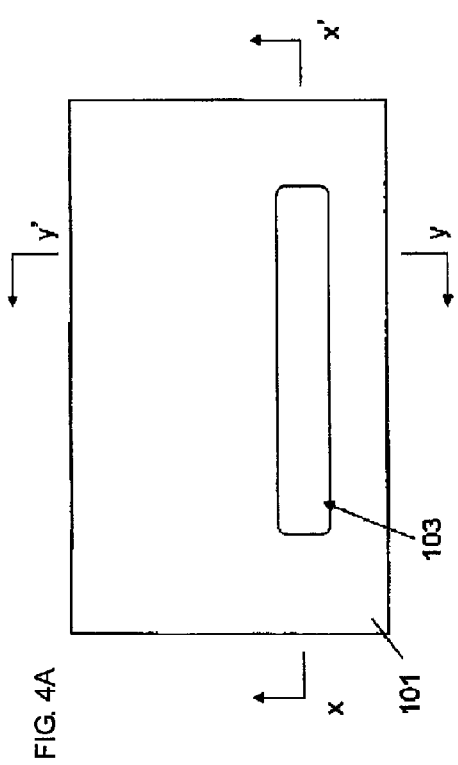
FIG. 4A is a plan view illustrating a method for producing a semiconductor device according to an embodiment of the present invention.
Figure 4B:
FIG. 4B is a sectional view taken along line X-X' of FIG. 4A.
Figure 4C:
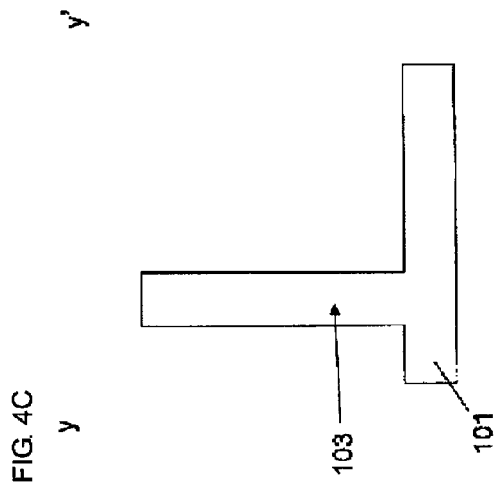
FIG. 4C is a sectional view taken along line Y-Y' of FIG. 4A.

As illustrated in FIGS. 4A to 4C, the first resist 102 is removed.

Figure 5A:
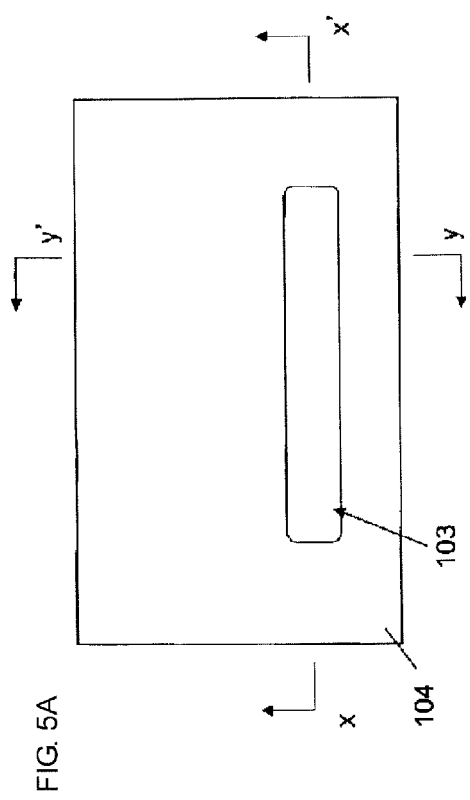
FIG. 5A is a plan view illustrating a method for producing a semiconductor device according to an embodiment of the present invention.
Figure 5B:
FIG. 5B is a sectional view taken along line X-X' of FIG. 5A.
Figure 5C:
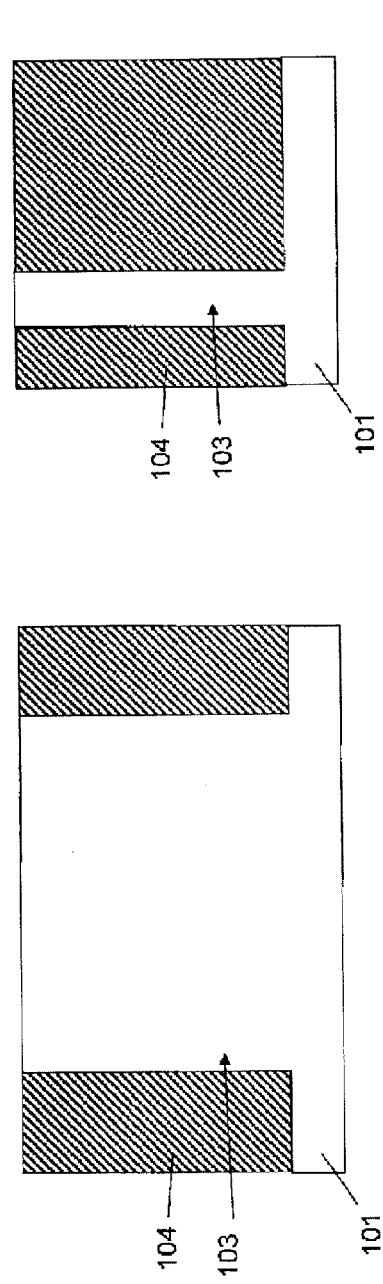
FIG. 5C is a sectional view taken along line Y-Y' of FIG. 5A.

As illustrated in FIGS. 5A to 5C, a fourth insulating film 104 is deposited around the fin-shaped silicon layer 103. An oxide film formed by high-density plasma or an oxide film formed by low-pressure chemical vapor deposition may be used as the fourth insulating film.

As illustrated in FIGS. 6A to 6C, the fourth insulating film 104 is etched back to expose an upper portion of the fin-shaped silicon layer 103.

As illustrated in FIGS. 7A to 7C, a first insulating film 105 is formed around the fin-shaped silicon layer 103 and on the fourth insulating film 104. A thermally oxidized film or an oxide film formed by low-pressure chemical vapor deposition may be used as the first insulating film. Alternatively, a nitride film or a high-K dielectric film may be used.

As illustrated in FIGS. 8A to 8C, a first metal film 106 is deposited around the first insulating film 105.

As illustrated in FIGS. 9A to 9C, the first metal film 106 is etched so as to be left as a sidewall around the fin-shaped silicon layer 103.

As illustrated in FIGS. 10A to 10C, a fifth insulating film 107 is deposited. An oxide film formed by high-density plasma or an oxide film formed by low-pressure chemical vapor deposition may be used as the fifth insulating film.

As illustrated in FIGS. 11A to 11C, the fifth insulating film 107 is etched back to expose an upper portion of the first metal film 106.

As illustrated in FIGS. 12A to 12C, the exposed first metal film 106 is removed.

Thus, the first step of forming a fin-shaped silicon layer 103 on a substrate 101, forming a first insulating film 105 around the fin-shaped silicon layer 103, and forming a first metal film 106 around the first insulating film 105 has been described.

Next, a second step of depositing a sixth insulating film around the fin-shaped semiconductor layer, etching back the sixth insulating film to expose an upper portion of the fin-shaped semiconductor layer, forming a second resist so that the second resist intersects the fin-shaped semiconductor layer perpendicularly, and etching the fin-shaped semiconductor layer and removing the second resist so that a portion in which the second resist intersects the fin-shaped semiconductor layer perpendicularly is formed into a pillar-shaped semiconductor layer.

Figure 13A:
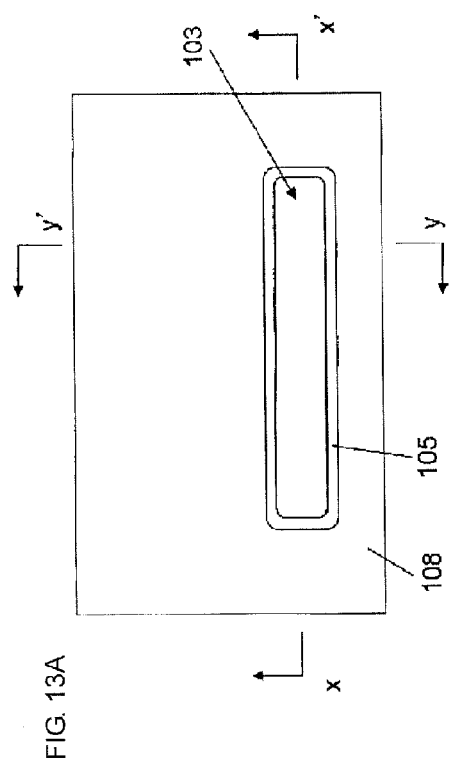
FIG. 13A is a plan view illustrating a method for producing a semiconductor device according to an embodiment of the present invention.
Figure 13C:
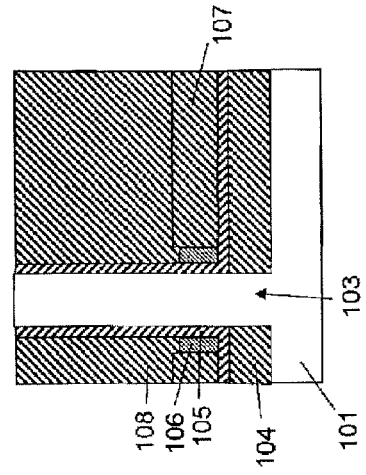
FIG. 13C is a sectional view taken along line Y-Y' of FIG. 13A.
Figure 13B:
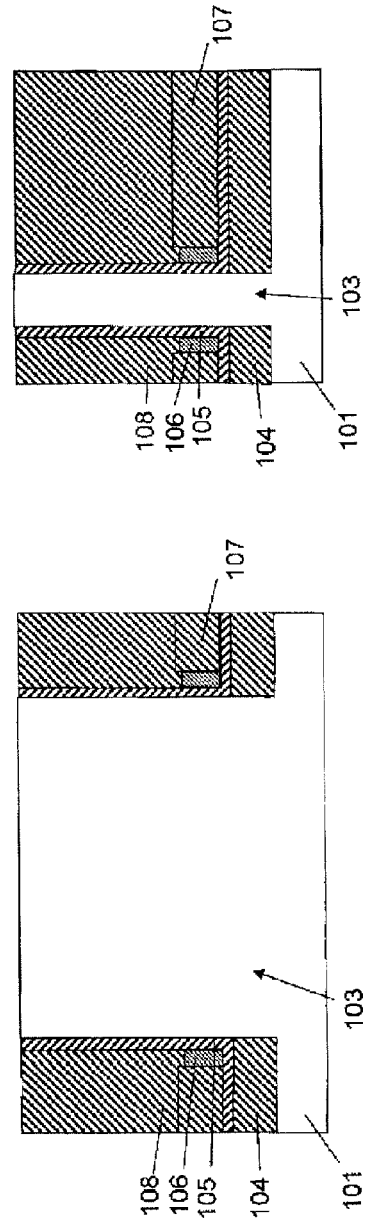
FIG. 13B is a sectional view taken along line X-X' of FIG. 13A.

As illustrated in FIGS. 13A to 13C, a sixth insulating film 108 is deposited around the fin-shaped silicon layer 103. An oxide film formed by high-density plasma or an oxide film formed by low-pressure chemical vapor deposition may be used as the sixth insulating film.

Figure 14A:
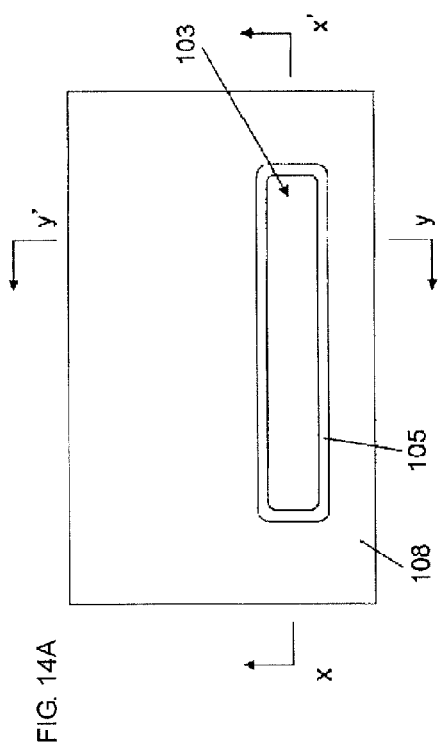
FIG. 14A is a plan view illustrating a method for producing a semiconductor device according to an embodiment of the present invention.
Figure 14C:
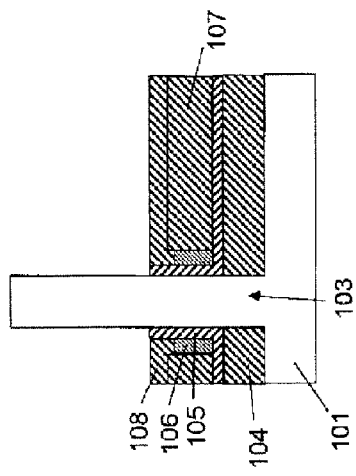
FIG. 14C is a sectional view taken along line Y-Y' of FIG. 14A.
Figure 14B:
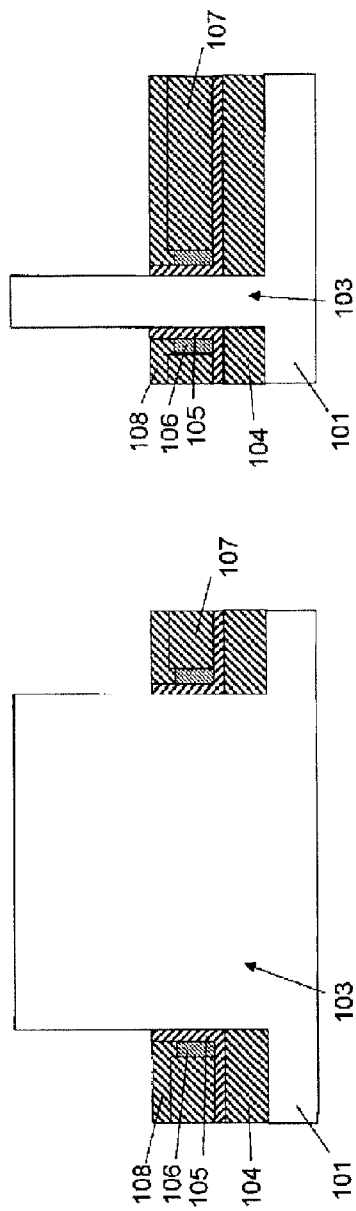
FIG. 14B is a sectional view taken along line X-X' of FIG. 14A.

As illustrated in FIGS. 14A to 14C, the sixth insulating film 108 is etched back to expose an upper portion of the fin-shaped silicon layer 103.

As illustrated in FIGS. 15A to 15C, a second resist 109 is formed so as to intersect the fin-shaped silicon layer 103 perpendicularly.

As illustrated in FIGS. 16A to 16C, the fin-shaped silicon layer 103 is etched to form a pillar-shaped silicon layer 110. A portion in which the second resist intersects the fin-shaped silicon layer 103 perpendicularly is formed into the pillar-shaped silicon layer 110. Therefore, the width of the pillar-shaped silicon layer 110 is equal to the length of a short side of the fin-shaped silicon layer 103.

As illustrated in FIGS. 17A to 17C, the second resist 109 is removed.

Thus, the second step of forming a pillar-shaped silicon layer 110 on the fin-shaped silicon layer 103 has been described.

Next, a third step of depositing a gate insulating film around the pillar-shaped semiconductor layer and on the fin-shaped semiconductor layer, depositing a third metal film so that the third metal film covers the gate insulating film, forming a third resist for forming a gate line, etching the third metal film to form a gate line, depositing a seventh insulating film, etching back the seventh insulating film to expose an upper portion of the third metal film, and removing the exposed third metal film will be described.

As illustrated in FIGS. 18A to 18C, the sixth insulating film 108 is etched to expose an upper portion of the first metal film 106 for the purpose of bringing the first metal film 106 close to a third metal 112. This step may be omitted.

As illustrated in FIGS. 19A to 19C, a gate insulating film 111 is deposited around the pillar-shaped silicon layer 110 and on the fin-shaped silicon layer 103. The gate insulating film 111 may be any film used in a semiconductor process, such as an oxide film, an oxynitride film, or a high-K dielectric film.

As illustrated in FIGS. 20A to 20C, a third metal film 112 is deposited so as to cover the gate insulating film 111. The third metal film 112 may be made of any metal that is used in a semiconductor process and sets the threshold voltage of a transistor. Herein, when the third metal 112 has a work function of 4.2 eV to 5.0 eV, the transistor can be operated as an enhancement type transistor.

Figure 21A:
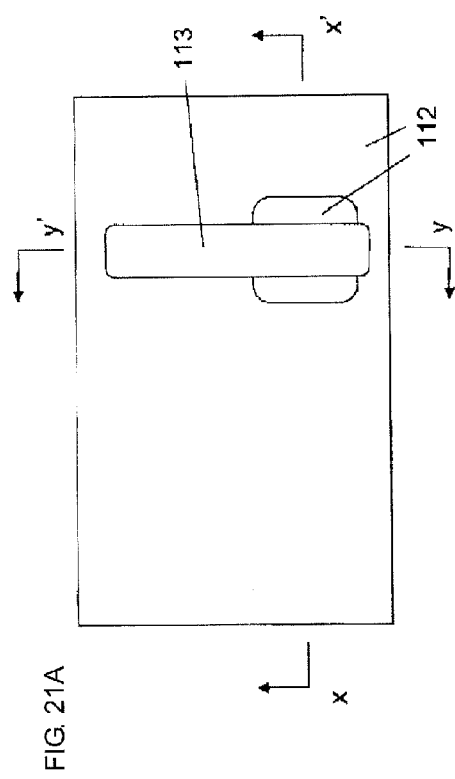
FIG. 21A is a plan view illustrating a method for producing a semiconductor device according to an embodiment of the present invention.
Figure 21C:
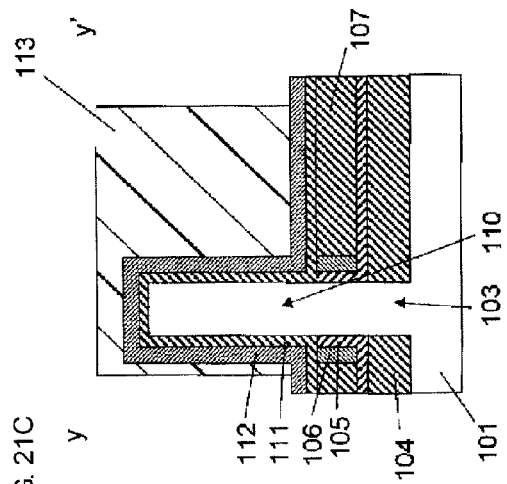
FIG. 21C is a sectional view taken along line Y-Y' of FIG. 21A.
Figure 21B:
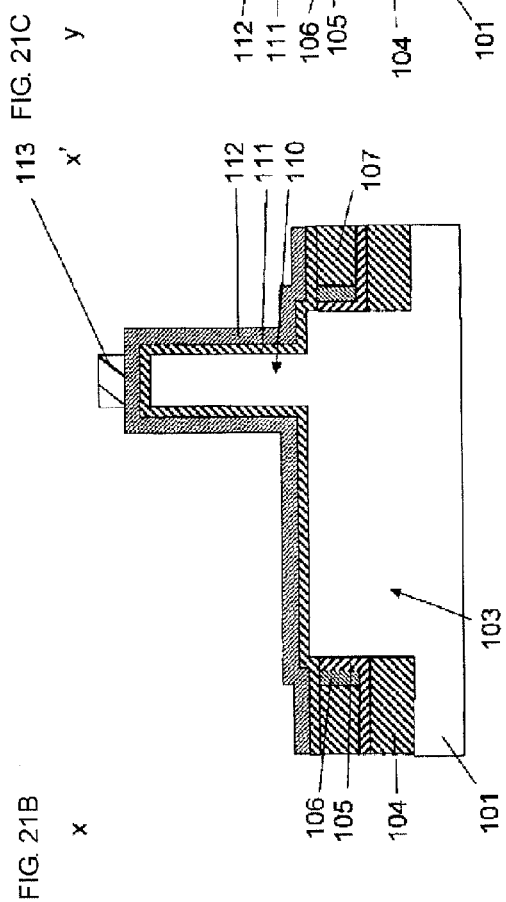
FIG. 21B is a sectional view taken along line X-X' of FIG. 21A.

As illustrated in FIGS. 21A to 21C, a third resist 113 for forming a gate line 112b is formed.

As illustrated in FIGS. 22A to 22C, the third metal film 112 is etched to form a gate line 112b.

As illustrated in FIGS. 23A to 23C, the third resist 113 is removed.

As illustrated in FIGS. 24A to 24C, a seventh insulating film 114 is deposited. An oxide film formed by high-density plasma or an oxide film formed by low-pressure chemical vapor deposition may be used as the seventh insulating film.

Figure 25A:
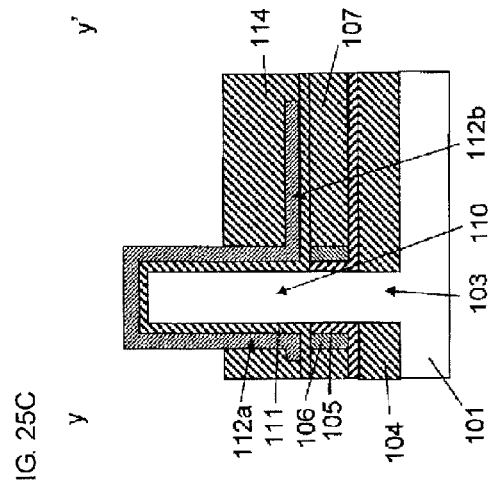
FIG. 25A is a plan view illustrating a method for producing a semiconductor device according to an embodiment of the present invention.
Figure 25B:
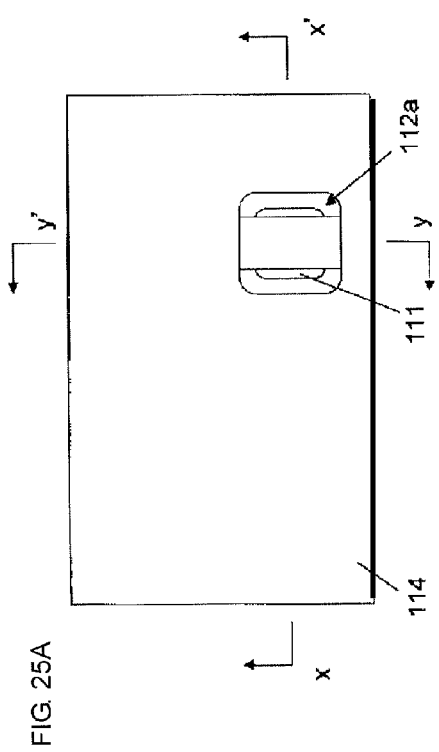
FIG. 25B is a sectional view taken along line X-X' of FIG. 25A.
Figure 25C:
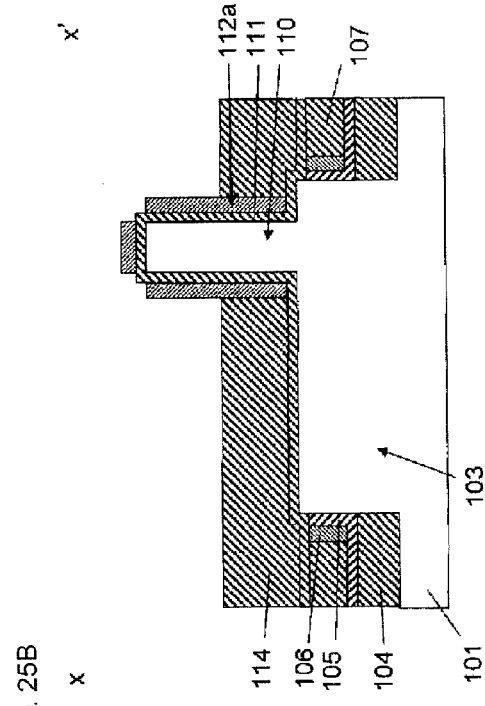
FIG. 25C is a sectional view taken along line Y-Y' of FIG. 25A.

As illustrated in FIGS. 25A to 25C, the seventh insulating film 114 is etched back to expose an upper portion of the third metal film 112.

As illustrated in FIGS. 26A to 26C, the exposed third metal film 112 is removed to form a gate electrode 112a.

Thus, the third step of forming a gate insulating film 111 around the pillar-shaped silicon layer 110 and forming a gate electrode 112a around the gate insulating film 111, the gate electrode 112a being made of a third metal 112, and a gate line 112b connected to the gate electrode 112a has been described.

Next, a fourth step of depositing an eighth insulating film on the pillar-shaped semiconductor layer, etching back the eighth insulating film to expose an upper portion of the pillar-shaped semiconductor layer, depositing a second insulating film on the pillar-shaped semiconductor layer, depositing a second metal film so that the second metal film covers the second insulating film, and etching the second metal film so that the second metal film is left as a sidewall around an upper portion of the pillar-shaped semiconductor layer will be described.

As illustrated in FIGS. 27A to 27C, an eighth insulating film 115 is deposited on the pillar-shaped silicon layer. An oxide film formed by high-density plasma or an oxide film formed by low-pressure chemical vapor deposition may be used as the eighth insulating film.

As illustrated in FIGS. 28A to 28C, the eighth insulating film 115 is etched back to expose an upper portion of the pillar-shaped silicon layer 110. When the gate insulating film 111 is sufficiently thin, the steps illustrated in FIGS. 27A to 27C and FIGS. 28A to 28C may be omitted.

As illustrated in FIGS. 29A to 29C, a second insulating film 116 is deposited on the pillar-shaped silicon layer 110. The second insulating film is preferably a film formed by deposition because a second metal film 117 and the gate electrode 112a are insulated from each other.

Figure 30A:
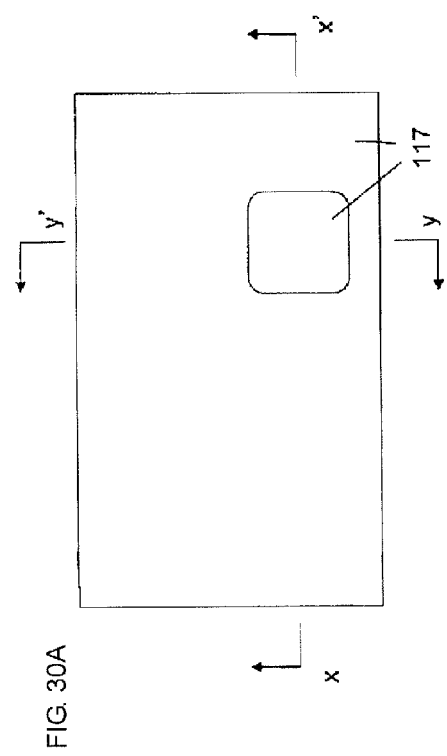
FIG. 30A is a plan view illustrating a method for producing a semiconductor device according to an embodiment of the present invention.
Figure 30C:
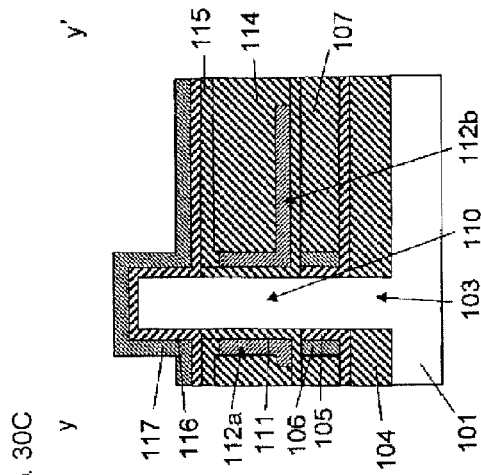
FIG. 30C is a sectional view taken along line Y-Y' of FIG. 30A.
Figure 30B:
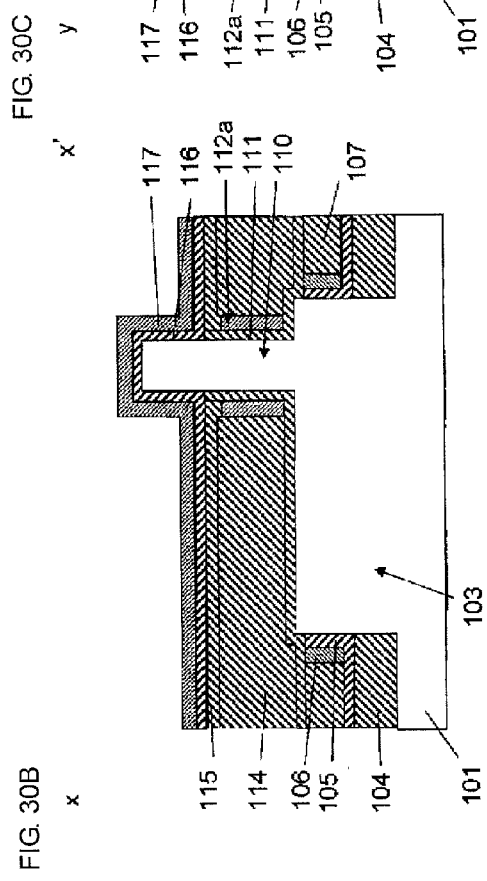
FIG. 30B is a sectional view taken along line X-X' of FIG. 30A.

As illustrated in FIGS. 30A to 30C, a second metal film 117 is deposited so as to cover the second insulating film 116.

As illustrated in FIGS. 31A to 31C, the second metal film 117 is etched so as to be left as a sidewall around an upper portion of the pillar-shaped silicon layer 110.

Thus, the fourth step of forming a second insulating film 116 around a sidewall of an upper portion of the pillar-shaped silicon layer 110 and forming a second metal film 117 around the second insulating film 116 has been described.

Next, as illustrated in FIGS. 32A to 32C, a ninth insulating film 118 is deposited.

As illustrated in FIGS. 33A to 33C, a fourth resist 119 for forming contact holes 120 and 121 is formed.

Figure 34A:
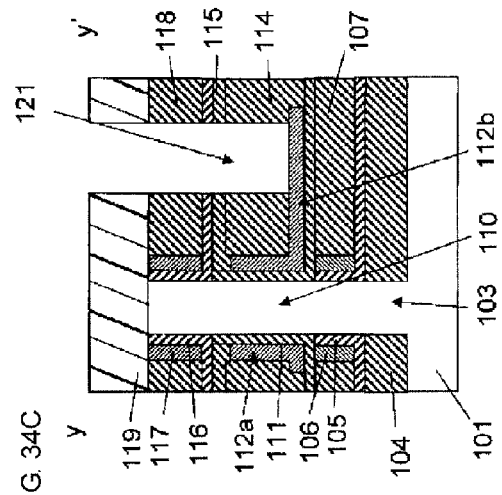
FIG. 34A is a plan view illustrating a method for producing a semiconductor device according to an embodiment of the present invention.
Figure 34B:
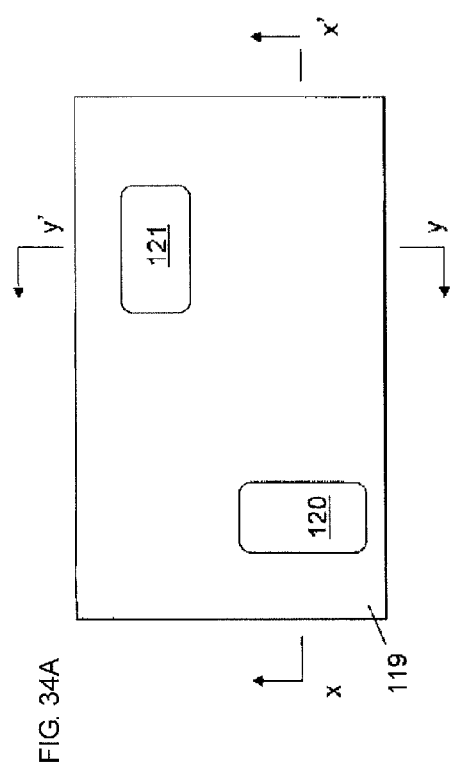
FIG. 34B is a sectional view taken along line X-X' of FIG. 34A.
Figure 34C:
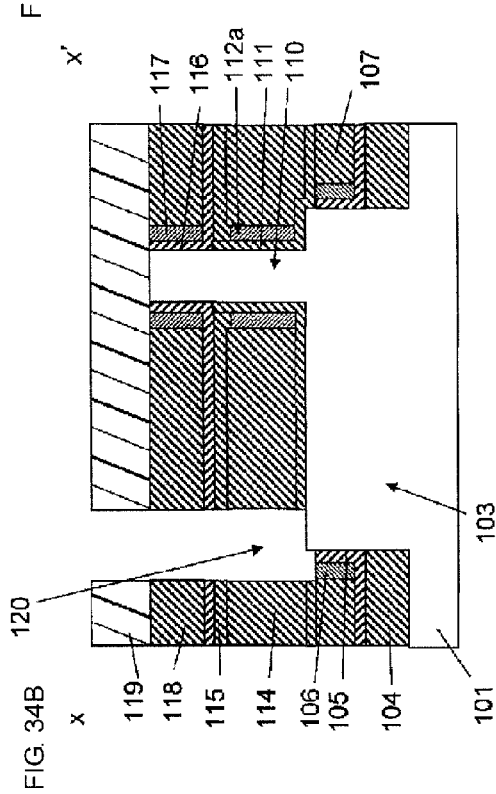
FIG. 34C is a sectional view taken along line Y-Y' of FIG. 34A.

As illustrated in FIGS. 34A to 34C, the insulating films are etched to form contact holes 120 and 121.

Figure 35A:
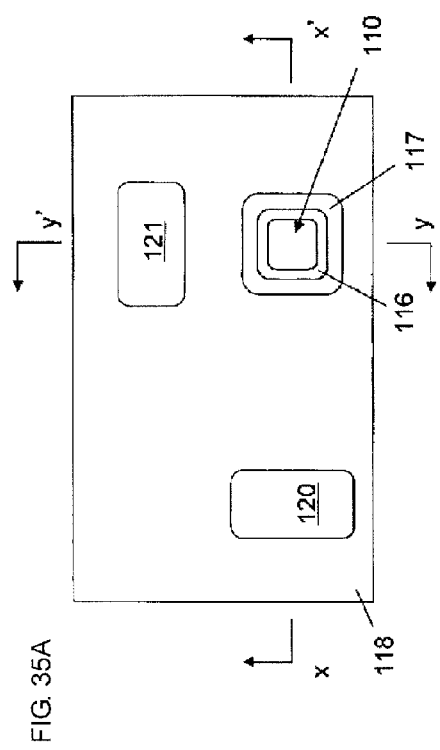
FIG. 35A is a plan view illustrating a method for producing a semiconductor device according to an embodiment of the present invention.
Figure 35C:
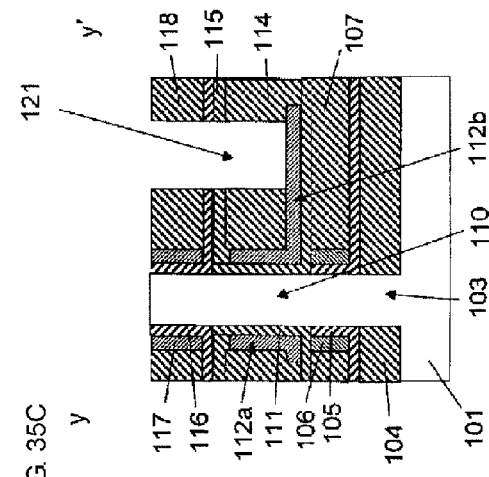
FIG. 35C is a sectional view taken along line Y-Y' of FIG. 35A.
Figure 35B:
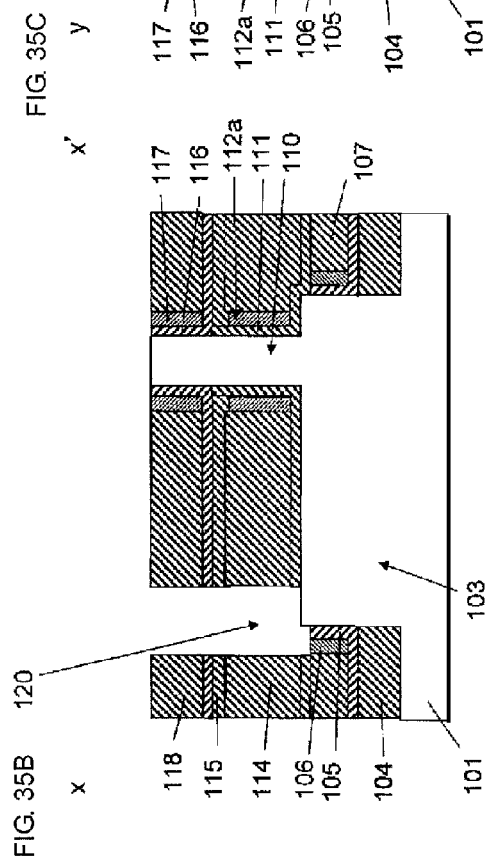
FIG. 35B is a sectional view taken along line X-X' of FIG. 35A.

As illustrated in FIGS. 35A to 35C, the fourth resist 119 is removed.

As illustrated in FIGS. 36A to 36C, a metal 124 is deposited to form contacts 122 and 123. The upper portion of the pillar-shaped silicon layer 110 and the second metal film 117 are connected to each other through a metal wiring 124, and the upper portion of the fin-shaped silicon layer and the first metal film 106 are connected to each other through the contact 122.

Figure 37A:
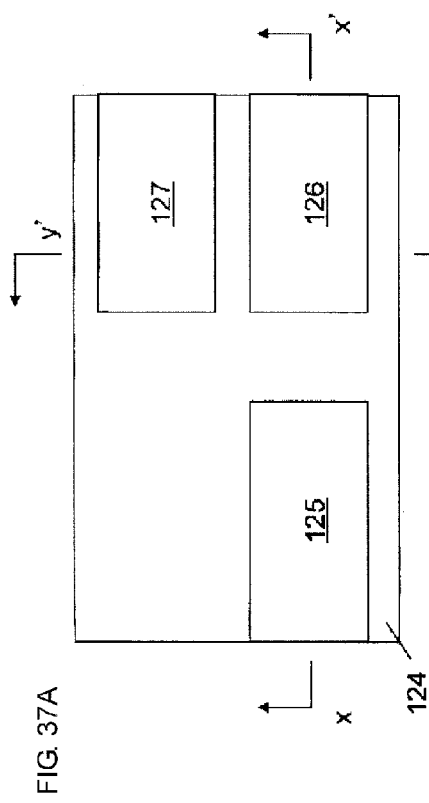
FIG. 37A is a plan view illustrating a method for producing a semiconductor device according to an embodiment of the present invention.
Figure 37C:
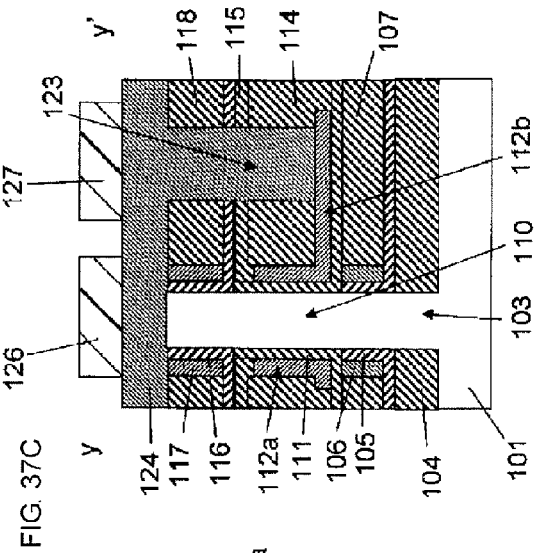
FIG. 37C is a sectional view taken along line Y-Y' of FIG. 37A.
Figure 37B:
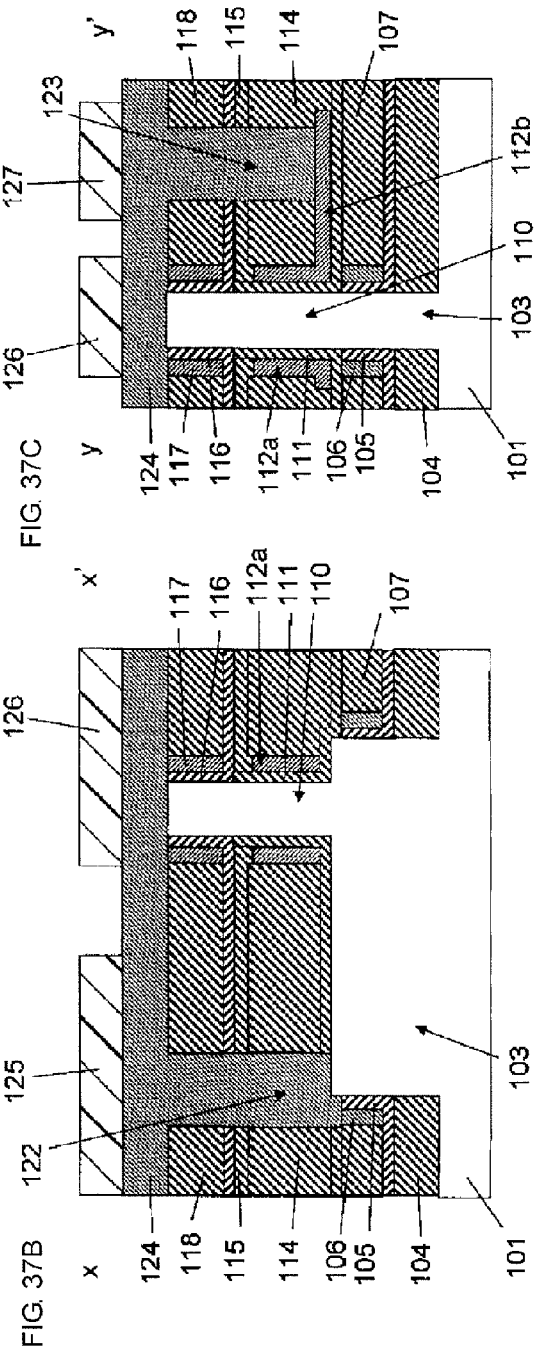
FIG. 37B is a sectional view taken along line X-X' of FIG. 37A.

As illustrated in FIGS. 37A to 37C, fifth resists 125, 126, and 127 for forming metal wirings 128, 129, and 130 are formed.

As illustrated in FIGS. 38A to 38C, the metal 124 is etched to form metal wirings 128, 129, and 130.

Figure 39A:
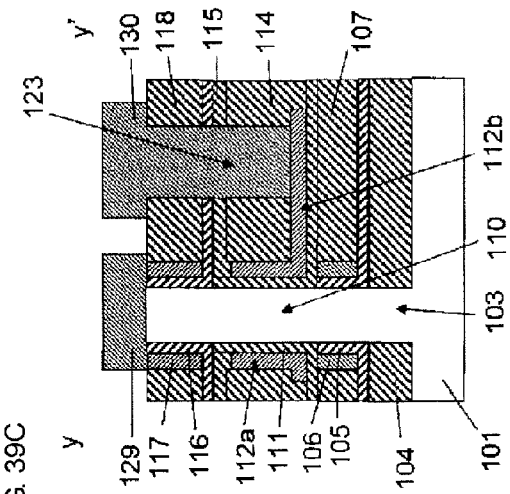
FIG. 39A is a plan view illustrating a method for producing a semiconductor device according to an embodiment of the present invention.
Figure 39B:
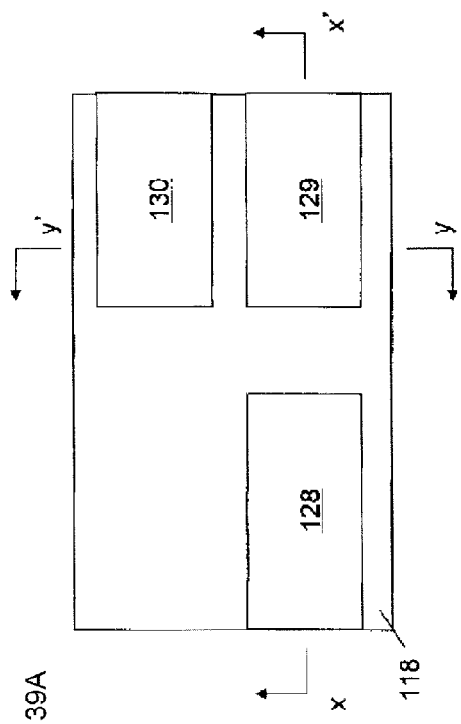
FIG. 39B is a sectional view taken along line X-X' of FIG. 39A.
Figure 39C:
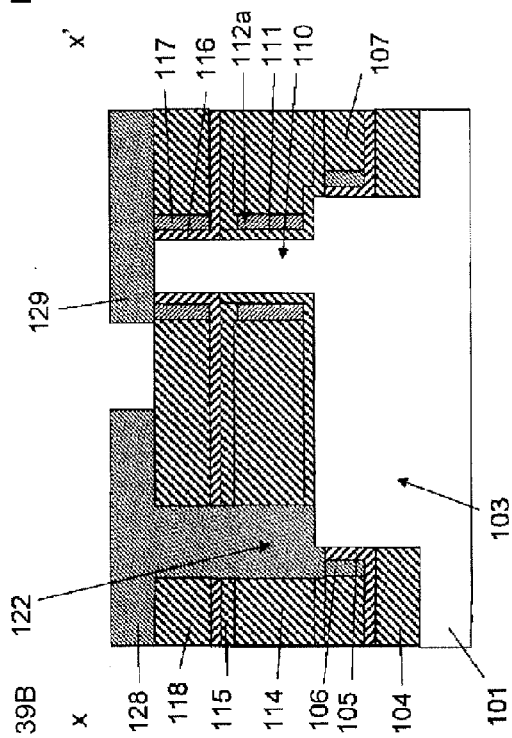
FIG. 39C is a sectional view taken along line Y-Y' of FIG. 39A.

As illustrated in FIGS. 39A to 39C, the fifth resists 125, 126, and 127 are removed.

Thus, the production process for forming an SGT structure according to an embodiment of the present invention has been described.

In the present invention, various embodiments and modifications can be made without departing from the broad spirit and scope of the present invention. Furthermore, the above-described embodiment is provided to describe one embodiment of the present invention, and the scope of the present invention is not limited thereto.

What is claimed is:

1. A semiconductor device comprising:
   a fin-shaped semiconductor layer on a substrate;
   a first insulating film around the fin-shaped semiconductor layer;
   a first metal film around the first insulating film;
   a pillar-shaped semiconductor layer on the fin-shaped semiconductor layer;
   a gate insulating film around the pillar-shaped semiconductor layer;
   a gate electrode around the gate insulating film and made of a third metal;
   a gate line connected to the gate electrode;
   a second insulating film around a sidewall of an upper portion of the pillar-shaped semiconductor layer; and a second metal film around the second insulating film,
wherein the upper portion of the pillar-shaped semiconductor layer and the second metal film are electrically connected to each other, and
an upper portion of the fin-shaped semiconductor layer and the first metal film are electrically connected to each other.

2. The semiconductor device according to claim 1, wherein the fin-shaped and pillar-shaped semiconductor layers are made of silicon.

3. The semiconductor device according to claim 2, wherein the first metal film and the second metal film have a work function of 4.0 eV to 4.2 eV.

4. The semiconductor device according to claim 2, wherein the first metal film and the second metal film have a work function of 5.0 eV to 5.2 eV.

5. The semiconductor device according to claim 1, wherein the pillar-shaped semiconductor layer has a width equal to a length of a short side of the fin-shaped semiconductor layer.

\* \* \* \* \*